(12) United States Patent  
Levy et al.

(10) Patent No.: US 12,479,739 B2  
(45) Date of Patent: Nov. 25, 2025

(54) TWO-DIMENSIONAL LEAD-FREE DOUBLE PEROVSKITE AND USES THEREOF

(71) Applicant: Technion Research & Development Foundation Ltd., Haifa (IL)

(72) Inventors: Shai Levy, Haifa (IL); Sasha Khalfin, Haifa (IL); Yehonadav Bekenstein, Haifa (IL)

(73) Assignee: Technion Research & Development Foundation Ltd., Haifa (IL)

( * ) Notice: Subject to any disclaimer, the term of this patent is extended or adjusted under 35 U.S.C. 154(b) by 1008 days.

(21) Appl. No.: 17/452,026

(22) Filed: Oct. 22, 2021

(65) Prior Publication Data  
US 2022/0127156 A1 Apr. 28, 2022

Related U.S. Application Data

(60) Provisional application No. 63/105,712, filed on Oct. 26, 2020.

(51) Int. Cl.  
  *C09K 11/62* (2006.01)  
  *C01G 15/00* (2006.01)  
  (Continued)

(52) U.S. Cl.  
  CPC ......... *C01G 15/006* (2013.01); *C09K 11/628* (2013.01); *B82Y 40/00* (2013.01); *C01P 2002/01* (2013.01); *C01P 2002/34* (2013.01); *C01P 2004/24* (2013.01); *C01P 2004/64* (2013.01); *C01P 2006/60* (2013.01)

(58) Field of Classification Search  
CPC . C09K 11/628; C09K 11/7435; C09K 11/756; C09K 11/58; H01L 21/021297; H01L 21/31691; H01L 2924/0571; C01G 3/04; C01G 5/02; C01G 9/04; C01G 30/006; C01G 15/006; C01G 29/006; C01G 7/006; B82Y 40/00; C01P 2002/34; C01P 2004/24; C01P 2004/64  
See application file for complete search history.

(56) References Cited

U.S. PATENT DOCUMENTS

2017/0152608 A1* 6/2017 Jin .................. H10K 71/12

OTHER PUBLICATIONS

Dahl et al. "Probing the Stability and Band Gaps of Cs2AgInCl6 and Cs2AgSbCl6 Lead-Free Double Perovskite Nanocrystals", Chem. Mater, 31. Supporting information only , 27 pages. (Year: 2019).*

(Continued)

*Primary Examiner* — Matthew E. Hoban  
*Assistant Examiner* — Lynne Edmondson  
(74) *Attorney, Agent, or Firm* — Knobbe, Martens, Olson & Bear, LLP

(57) ABSTRACT

The present invention provides a two-dimensional double perovskite nanomaterial represented by the formula $Cs_2ABX_6$ or $L_4[Cs_2ABX_6]_{n-1}ABX_8$, wherein A is a metal ion selected from Ag(I), Au(I), and Cu(I); B is a metal ion selected from In(III), Bi(III), Sb(III), Fe(III), and Tl(III); X is a halogen; L is a ligand; and n represents the number of metal-halide octahedral layers present in said nanomaterial. The invention further provides a light emitting material and electronic-, optic-, or optoelectronic device comprising said nanomaterial; as well as methods for the preparation of said nanomaterial.

28 Claims, 11 Drawing Sheets

(51) Int. Cl.
  C09K 11/58   (2006.01)
  C09K 11/74   (2006.01)
  C09K 11/75   (2006.01)
  B82Y 40/00   (2011.01)

(56) References Cited

OTHER PUBLICATIONS

Dahl et al. "Probing the Stability and Band Gaps of Cs2AgInCl6 and Cs2AgSbCl6 Lead-Free Double Perovskite Nanocrystals", Chem. Mater, 31. Supporting information only , 27 pages. (Year: 2019).*

Hutter et al., "Band-like Charge Transport in Cs2AgBiBr6 and Mixed Antimony-Bismuth Cs2AgBi1-xSbxBr6 Halide Double Perovskites", ACS Omega 2018, 3, pp. 11655-11662. (Year: 2018).*

Akkerman et al., "Tuning the Optical Properties of Cesium Lead Halide Perovskite Nanocrystals by Anion Exchange Reactions"; Journal of The American Chemical Society, 137(32), pp. 10276-10281 (2015).

Akkerman et al., "Genesis, challenges and opportunities for colloidal lead halide perovskite nanocrystals"; Nature Materials, vol. 17, pp. 394-405 (2018).

Babayigit et al., "Assessing the toxicity of Pb-and Sn-based perovskite solar cells in model organism Danio rerio"; Scientific Reports, 6, 18721. (2016).

Bekenstein et al., "The Making and Breaking of Lead-Free Double Perovskite Nanocrystals of Cesium Silver-Bismuth Halide Compositions"; Nano Letters, 18(6), pp. 3502-3508 (2018).

Chen et al., "Yb- and Mn-doped Lead-Free Double Perovskite Cs2AgBiX6 (X=Cl-, Br-) Nanocrystals"; ACS Applied Materials & Interfaces, 11(18), pp. 16855-16863 (2019).

Connor et al., "Dimensional reduction of the small-bandgap double perovskite Cs2AgTlBr6" Chemical Science, 11, pp. 7708-7715 (2020).

Creutz et al., "Colloidal Nanocrystals of Lead-Free Double-Perovskite (Elpasolite) Semiconductors: Synthesis and Anion Exchange To Access New Materials"; Nano Letters, 18(2), pp. 1118-1123 (2018).

Dahl et al., "Probing the Stability and Band Gaps of Cs2AgInCl6 and Cs2AgSbCl6 Lead-Free Double Perovskite Nanocrystals" Chemistry of Materials, 31(9), pp. 3134-3143 (2019).

Dang et al., "In Situ Transmission Electron Microscopy Study of Electron Beam-Induced Transformations in Colloidal Cesium Lead Halide Perovskite Nanocrystals"; ACS Nano, 11(2), pp. 2124-2132 (2017).

Giustino et al., "Toward Lead-Free Perovskite Solar Cells" ; ACS Energy Letters, 1(6), pp. 1233-1240 (2016).

Hailegnaw et al., "Rain on Methylammonium Lead Lodide Based Perovskites: Possible Environmental Effects of Perovskite Solar Cells"; The Journal of Physical Chemistry Letter, 6(9), pp. 1543-1547 (2015).

Karthika et al., "A Review of Classical and Nonclassical Nucleation Theories"; Crystal Growth & Design, 16(11), pp. 6663-6681 (2016).

Khalfin et al., "Advances in lead-free double perovskite nanocrystals, engineering band-gaps and enhancing stability through composition tunability"; Nanoscale, 11(18), pp. 8665-8679 (2019).

Kovalenko et al., "Properties and potential optoelectronic applications of lead halide perovskite nanocrystals"; Science Section, 358(6364), pp. 745-750 (2017).

Liu et al., "Design Optimization of Lead-Free Perovskite Cs2AgInCl6: Bi Nanocrystals with 11.4% Photoluminescence Quantum Yield"; Chemistry of Materials, 31, pp. 3333-3339 (2019).

Locardi et al., "Colloidal Synthesis of Double Perovskite Cs2AgInCl6 and Mn-doped Cs2AgInCl6 Nanocrystals"; Journal of the American Chemical Society; 140(40), pp. 12989-12995 (2018).

Locardi et al., "Emissive Bi-doped Double Perovskite Cs2Ag1-xNaxInCl6 Nanocrystals"; ACS Energy Letters, 4(8), pp. 1976-1982 (2019).

Luo et al., "Efficient and stable emission of warm-white light from lead-free halide double perovskites"; Nature, vol. 563, pp. 541 (2018).

Muhammed et al., "Growth of In Situ Functionalized Luminescent Silver Nanoclusters by Direct Reduction and Size Focusing"; ACS Nano, vol. 6, No. 10, pp. 8950-8961 (2012).

Shamsi et al., "Colloidal Synthesis of Quantum Confined Single Crystal CsPbBr3 Nanosheets with Lateral Size Control up to the Micrometer Range"; Journal of the American Chemical Society, 138(23), pp. 7240-7243 (2016).

Slavney et al., "Bismuth-Halide Double Perovskite with Long Carrier Recombination Lifetime for Photovoltaic Applications"; Journal of the American Chemical Society, 138(7), pp. 2138-2141 (2016).

Soni et al., "Investigating effect of strain on electronic and optical properties of lead free double perovskite Cs2AgInCl6 solar cell compound: A first principle calculation"; Journal of Alloys and Compounds, 817, pp. 152758 (2020).

Swarnkar et al., "Beyond Colloidal Cesium Lead Halide Perovskite Nanocrystals: Analogous Metal Halides and Doping"; ACS Energy Letters, 2(5), pp. 1089-1098 (2017).

Taleb et al., "Optical Properties of Self-Assembled 2D and 3D Superlattices of Silver Nanoparticles"; J. Phys. Chem. B, 102(12), pp. 2214-2220 (1998).

Udayabhaskararao et al., "Nucleation, Growth, and Structural Transformations of Perovskite Nanocrystals"; Chemistry of Materials, 29(3), pp. 1302-1308 (2017).

Vehkamäki, "Classical Nucleation Theory in Multicomponent Systems"; Published by: Springer Berlin Heidelberg, ISBN:9783540312185. (2006).

Volonakis et al. "Lead-Free Halide Double Perovskites via Heterovalent Substitution of Noble Metals"; The Journal of Physical Chemistry Letters, 7, 1254-1259 (2016).

Volonakis et al., "Cs2InAgCl6: A New Lead-Free Halide Double Perovskite with Direct Band Gap"; he Journal of Physical Chemistry Letters, 8(4), pp. 772-778 (2017).

Willets et al., "Localized Surface Plasmon Resonance Spectroscopy and Sensing"; Annu. Rev. Phys. Chem., 58, pp. 267 (2007).

Yang et al., "Optical dielectric function of silver"; Physical Review, B 91, pp. 235137 (2015).

* cited by examiner

Fig. 3A
Fig. 3B
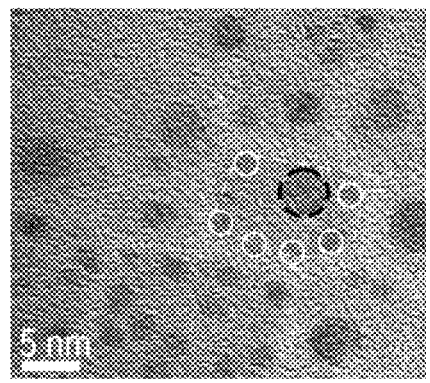
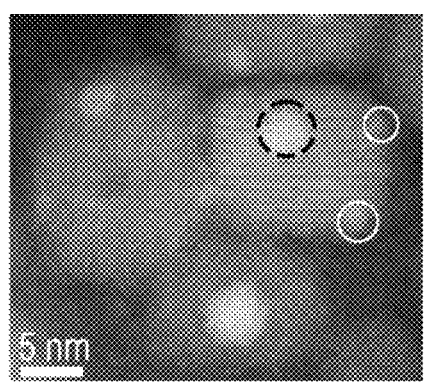
◯ Central primary NP population
○ Small secondary decoration NP
Fig. 3C
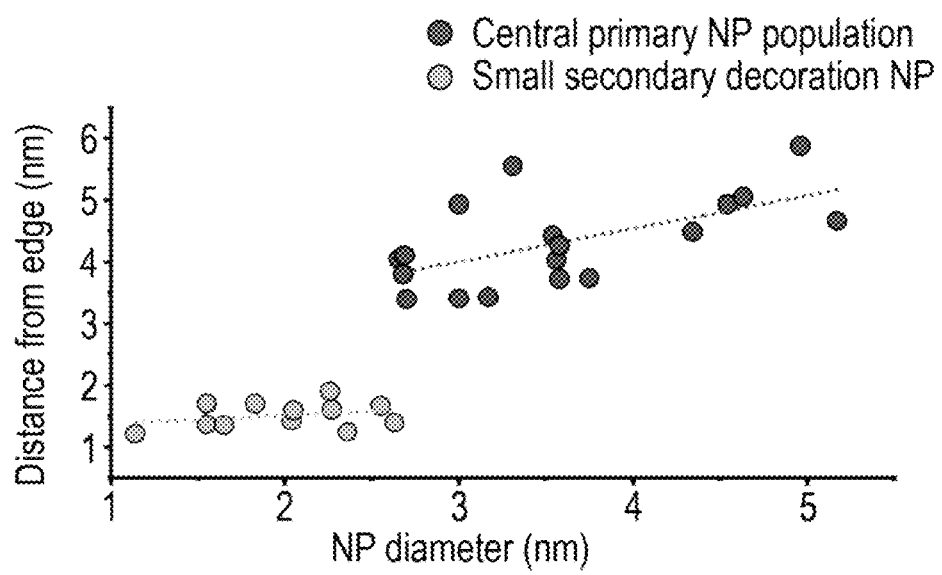

TWO-DIMENSIONAL LEAD-FREE DOUBLE PEROVSKITE AND USES THEREOF

CROSS REFERENCE TO RELATED APPLICATIONS

This application claims the benefit under 35 USC § 119(e) of U.S. Patent Application No. 63/105,712, filed on Oct. 26, 2020, which is hereby incorporated by reference 37 CFR 1.57.

TECHNICAL FIELD

The present invention provides a two-dimensional double perovskite nanomaterial represented by the formula $Cs_2ABX_6$ or $L_4[Cs_2ABX_6]_{n-1}ABX_8$, wherein A is a metal ion selected from Ag(I), Au(I), and Cu(I); B is a metal ion selected from In(III), Bi(III), Sb(III), Fe(III), and Tl(III); X is a halogen; L is a ligand; and n represents the number of metal-halide octahedral layers present in said nanomaterial. The invention further provides a light emitting material and electronic/optic/optoelectronic device comprising said nanomaterial, as well as methods for the preparation of said nanomaterial.

BACKGROUND

The research of colloidal cesium lead halide perovskite (LHP) nanocrystals has grown rapidly in recent years due to their attractive optoelectronic properties. Lead halide perovskite nanocrystals have been employed in various applications, such as solar cells, light emitting diodes, and photodetectors (Kovalenko et al., 2017; Akkerman et al., 2018). However, the use of lead remains a major setback due to its toxicity (Swamkar et al., 2017; Babayigit et al., 2016) and water solubility (Hailegnaw et al., 2015). This has accelerated the study of alternative stable and environmentally sustainable metal halide perovskite nanocrystal (NC) systems.

One optional replacement of lead is by using a combination of a monovalent and a trivalent cation to form double perovskites (DP) with stoichiometry of $A_2M^+M^{+3}X_6$ (Volonakis et al., 2016; Giustino and Snaith, 2016; Khalfin and Bekenstein, 2019). Initially, research was centered on $Cs_2AgBiBr_6$ (Bekenstein et al., 2018; Creutz et al., 2018) which is an indirect band gap semiconductor exhibiting long excited state lifetimes (Slavney et al., 2016). Alternative cations have also been explored, leading to recently reported direct-bandgap $Cs_2AgTlBr_6$ (Connor et al., 2020) and $Cs_2AgInCl_6$ (Locardi et al., 2018; Dahl et al., 2019) DP semiconductors. In the $Cs_2AgInCl_6$ system, efforts were made in order to increase photoluminescence quantum yield for light emitting applications (Dahl et al., 2019; Luo et al., 2018). These research include alloying with sodium ions and doping with various elements such as Bi (Liu et al., 2019; Locardi et al., 2019; Chen et al., 2019), Mn (Locardi et al., 2018) and Yb (Chen et al., 2019) ions. The presence of a silver component in a halide perovskite crystal matrix, which is infamously known for its low melting temperatures, facile anion exchange (Akkerman et al., 2015), and degradation tendencies, have raised material stability concerns.

Here we investigate a common inhomogeneity in the silver-containing double perovskites, e.g., $Cs_2AgInCl_6$ and $Cs_2AgBiBr_6$ NCs. These inhomogeneities present themselves as small, seemingly spherical, and high-contrast nanoparticles (NP) under transmission electron microscope (TEM) characterization (Bekenstein et al., 2018; Locardi et al., 2018). Past structural and elemental analysis of these NPs both in the silver-indium and silver-bismuth systems have identified these as metallic silver NPs. However, the origins of these NPs are a subject of an ongoing scientific debate. While studying the silver-indium system, Locardi et al. suggested that reduction of $Ag^+$ by the electron beam during the TEM characterization is the origin of the metallic silver NPs (Locardi et al., 2018). For the silver-bismuth system, the origin of $Ag^°$ NPs was assigned to degradation of $Cs_2AgBiBr_6$ NCs (Bekenstein el al., 2018) as supported by the size increase of $Ag^°$ NP decorating the $Cs_2AgBiBr_6$ NCs with increased reaction time. It is worth noting that similar inhomogeneities are observed also in Ag-free perovskites. For example, in the more explored lead halide perovskite nanocrystals, high-contrast NPs are also observed. Those NPs are identified as metallic lead NPs which further emphasizes the chemical analogy between LHP and lead-free DP colloidal systems. While many researchers assigned these to post synthesis degradation (Dang et al., 2017; Shamsi et al., 2016). An alternative explanation claiming lead NPs act as nucleation seeds for LHP nucleation was presented by Udayabhaskararao et al. (2017). This claim was supported by the presence of the metallic lead NPs prior to the addition of Cs to the reaction mixture and therefore, predating the formation of LHP nanocrystals. Intrigued by this scientific debate we set to explore for empirical evidence in order to determine the role of silver nanoparticles in lead-free perovskites.

SUMMARY OF INVENTION

In one aspect, the present invention provides a two-dimensional (2D) double perovskite nanomaterial represented by the formula $Cs_2ABX_6$ or $L_4[Cs_2ABX_6]_{n-1}ABX_8$, wherein:
  A is a metal ion selected from silver (Ag(I)), gold (Au(I)), and cuprous (Cu(I));
  B is a metal ion selected from indium(III) (In(III)), bismuth(III) (Bi(III)), antimony(III) (Sb(III)), iron(III) (Fe(III)), and thallium(III) (Tl(III));
  X is a halogen, preferably Cl;
  L each independently is an organic ligand of the formula R—COO⁻ or R—CH$_2$NH$_3^+$, or of the formula (R)$_3$—P or (R)$_3$—P=O, wherein R each independently is selected from ($C_2$-$C_{19}$)alkyl, ($C_2$-$C_{19}$)alkenyl, ($C_2$-$C_{19}$) alkynyl, and ($C_6$-$C_{14}$)aryl; and
  n is an integer of 2-20, e.g., 2-10, representing the number of metal-halide octahedral layers present in the nanomaterial.

In another aspect, the present invention provides a light emitting material, e.g., a semiconductor material or a high energy x-ray or gamma-ray scintillator, comprising a 2D double perovskite nanomaterial represented by the formula $Cs_2ABX_6$ or $L_4[Cs_2ABX_6]_{n-1}$ $ABX_8$ as defined above. In particular such light emitting materials, said 2D double perovskite nanomaterial is represented by the formula $Cs_2AgInX_6$ or $L_4[Cs_2AgInX_6]_{n-1}AgInX_8$, wherein X is a halogen such as Cl or Br. A more particular such nanomaterial is represented by the formula $Cs_2AgInCl_6$ or $L_4[Cs_2AgInCl_6]_{n-1}AgInCl_8$, wherein n is an integer of 2-20, e.g., 2-10, representing the number of metal-chloride octahedral layers present in said double perovskite nanomaterial.

In a further aspect, the invention provides an electronic-, optic-, or optoelectronic device comprising, as a semiconductor material or scintillator, a 2D double perovskite nanomaterial represented by the formula $Cs_2ABX_6$ or $L_4[Cs_2ABX_6]_{n-1}ABX_8$ as defined above. In particular such devices, said 2D double perovskite nanomaterial is represented by the formula $Cs_2AgInX_6$ or $L_4[Cs_2AgInX_6]_{n-1}AgInX_8$, wherein X is a halogen such as Cl or Br. A more particular such nanomaterial is represented by the formula $Cs_2AgInCl_6$ or $L_4[Cs_2AgInCl_6]_{n-1}AgInCl_8$, wherein n is an integer of 2-20, e.g., 2-10, representing the number of metal-chloride octahedral layers present in said double perovskite nanomaterial.

In yet another aspect, the present invention relates to a process for the preparation of a 2D double perovskite nanomaterial represented by the formula $Cs_2ABX_6$ or $L_4[Cs_2ABX_6]_{n-1}ABX_8$, wherein A is a metal ion selected from the group consisting of Ag(I), Au(I), and Cu(I); B is a metal ion selected from the group consisting of In(III), Bi(III), Sb(III), Fe(III), and Tl(III); X is a halogen, preferably Cl; L each independently is an organic ligand of the formula R—COO$^-$ or R—CH$_2$NH$_3{}^+$, or of the formula (R)$_3$—P or (R)$_3$—P═O, wherein R each independently is selected from the group consisting of (C$_2$-C$_{19}$)alkyl, (C$_2$-C$_{19}$)alkenyl, (C$_2$-C$_{19}$)alkynyl, and (C$_6$-C$_{14}$)aryl; and n is an integer of 2 to 20, e.g., 2-10, representing the number of metal-halide octahedral layers present in the nanomaterial, said process comprising:
(i) mixing a salt of metal ion A, a salt of metal ion B, and either a cesium salt or a source of said halogen, in a solvent, preferably a non-coordinating solvent, in the presence of an acid-base couple comprising a mixture of (a) an acid of the formula R—COOH and a base of the formula R—CH$_2$NH$_2$; or (b) an acid of the formula (R)$_3$—P═O and a base of the formula (R)$_3$—P;
(ii) optionally heating the mixture obtained in (i) to a temperature of up to about 100° C., i.e., to a temperature above room temperature and up to about 40° C., 50° C., 60° C., 70° C., 80° C., 70° C., 90° C., or about 100° C.; and
(iii) introducing, e.g., by rapidly injecting, a nucleation initiator into the reaction mixture obtained in (ii) to thereby initiate assembly of said 2D double perovskite nanomaterial,
provided that:
(a) when said cesium salt is included within the salts mixed in step (i), said nucleation initiator is a benzoyl halide of the formula C$_6$H$_5$—C(O)—X, and the introduction of said nucleation initiator is followed by cooling of the reaction mixture, when necessary, to room temperature, to thereby obtain said 2D double perovskite nanomaterial in said solvent; and
(b) when said cesium salt is not included within the salts mixed in step (ii), said nucleation initiator is a compound of the formula Cs—R, and the introduction of said nucleation initiator is preceded by cooling the reaction mixture, when necessary, to room temperature, to thereby obtain said 2D double perovskite nanomaterial in said solvent.

In still another aspect, the present invention relates to a process for the preparation of a two-dimensional (2D) double perovskite nanomaterial represented by the formula $Cs_2ABX_6$ or $L_4[Cs_2ABX_6]_{n-1}ABX_8$, wherein A is a metal ion selected from the group consisting of Ag(I), Au(I), and Cu(I); B is a metal ion selected from the group consisting of In(III), Bi(III), Sb(III), Fe(III), and Tl(III); X is a halogen, preferably Cl; L each independently is an organic ligand of the formula R—COO$^-$ or R—CH$_2$NH$_3{}^+$, or of the formula (R)$_3$—P or (R)$_3$—P═O, wherein R each independently is selected from the group consisting of (C$_2$-C$_{19}$)alkyl, (C$_2$-C$_{19}$)alkenyl, (C$_2$-C$_{19}$)alkynyl, and (C$_6$-C$_{14}$)aryl; n is an integer of 2 to 20, e.g., 2-10, representing the number of metal-halide octahedral layers present in the nanomaterial; and said nanomaterial has the shape of a nanosheet, said process comprising:
(i) providing a solution of a double perovskite nanomaterial represented by the formula $Cs_2ABX_6$ or $L_4[Cs_2ABX_6]_{n-1}ABX_8$ in a solvent, preferably a non-coordinating solvent, wherein said nanomaterial is either a three-dimensional (3D) material having the shape of nanocubes or a 2D material having the shape of nanoplates;
(ii) evaporating said solvent, in a controlled manner, to thereby allow self-assembly of a solid array of said double perovskite nanomaterial; and
(iii) recrystallizing (fusing) said solid array with either chemical or physical means to thereby obtain said 2D double perovskite nanomaterial.

In yet a further aspect, the invention provides a double perovskite building block represented by the formula $L_4ABX_8$, wherein:
A is a metal ion selected from the group consisting of Ag(I), Au(I), and Cu(I);
B is a metal ion selected from the group consisting of In(III), Bi(III), Sb(III), Fe(III), and Tl(III);
X is a halogen, preferably Cl; and
L each independently is an organic ligand of the formula R—COO$^-$ or R—CH$_2$NH$_3{}^+$, or of the formula (R)$_3$—P or (R)$_3$—P═O, wherein R each independently is selected from the group consisting of (C$_2$-C$_{19}$)alkyl, (C$_2$-C$_{19}$)alkenyl, (C$_2$-C$_{19}$)alkynyl, and (C$_6$-C$_{14}$)aryl.

In still a further aspect, the invention relates to a process for the preparation of a 2D double perovskite nanomaterial represented by the formula $Cs_2ABX_6$ or $L_4[Cs_2ABX_6]_{n-1}ABX_8$, wherein A is a metal ion selected from the group consisting of Ag(I), Au(I), and Cu(I); B is a metal ion selected from the group consisting of In(III), Bi(III), Sb(III), Fe(III), and Tl(III); X is a halogen; L each independently is an organic ligand of the formula R—COO$^-$ or R—CH$_2$NH$_3{}^+$, or of the formula (R)$_3$—P or (R)$_3$—P═O, wherein R each independently is selected from the group consisting of (C$_2$-C$_{19}$)alkyl, (C$_2$-C$_{19}$)alkenyl, (C$_2$-C$_{19}$)alkynyl, and (C$_6$-C$_{14}$)aryl; and n is an integer of 2 to 20, representing the number of metal-halide octahedral layers present in the nanomaterial, said process comprising:
(i) mixing a double perovskite building block as defined above and a cesium salt in a solvent, preferably a non-coordinating solvent;
(ii) heating the mixture obtained in (i) to a temperature of, e.g., from about 80° C. to about 120° C.; and
(iii) introducing a cesium salt into said solvent to thereby initiate assembly of said 2D double perovskite nanomaterial.

BRIEF DESCRIPTION OF DRAWINGS

FIGS. 3A-3C show high-resolution TEM (3A) and high-resolution HAADF-STEM (3B) of $Cs_2AgInCl_6$ NCs exhibiting multiple and various sizes of silver NPs decorations per nano-cube. Smaller silver NPs are located near edges and corners of the nano-cube while the main central silver NP is larger. (3C) Plot demonstrating correlation of silver NPs diameter vs. distance from the edge of the $Cs_2AgInCl_6$ NC. Two distinct populations are portrayed the central primary NP population further from edges and the small secondary decorations NP closer to edges.

DETAILED DESCRIPTION OF INVENTION

Figure 1A:
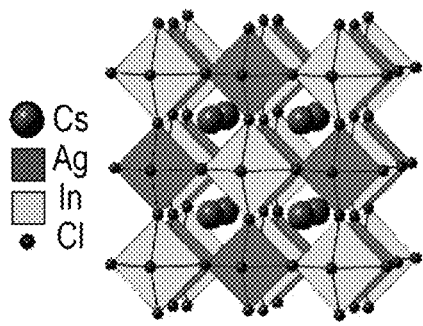
FIGS. 1A-1D show $Cs_2AgInCl_6$ double perovskite crystallographic structure (1A); Low-resolution TEM of rectangular $Cs_2AgInCl_6$ NCs with high-contrast spherical NPs decorations (1B); SAED of $Cs_2AgInCl_6$ NCs presenting polycrystalline ring pattern. The SAED reveals two phases assign to $Cs_2AgInCl_6$ and metallic Ag or AgCl (1C); XRD pattern of $Cs_2AgInCl_6$ nanocrystals, diffraction shows two distinct phases assign for $Cs_2AgInCl_6$ (bulk references ICDD number 01-085-7533) and AgCl (ICDD number 1-1013) (1D).

As described herein, by a series of synthetic experiments in which we have systematically modified reported reactions for the formation of $Cs_2AgInCl_6$ cube nanocrystals, we were able to identify key ingredients that promote the formation of 2D $Cs_2AgInCl_6$ nanoplates and nanosheets.

As has been specifically found in accordance with the present invention, under certain thermodynamic growth conditions, $Cs_2AgInCl_6$ tend to form 2D nanostructures, which could be either colloidal nanoplates or larger 2D sheets, that have not been reported before. Such $Cs_2AgInCl_6$ nanoplates are exciting since they present a new method for breaking the local cubic high symmetry, thereby altering the local environment surrounding the trapped exciton without the need of alloying and doping. In this case, instead of compositional tuning, breaking of local symmetry is achieved naturally, either externally via the close proximity of surfaces and interfaces that may present charged traps and therefore induce anisotropic fields, or internally via microstructural structural deformations.

Halide perovskite are soft materials and susceptible to mechanical deformation. For example, when perovskite sheets are deposited on hard surfaces, bending and folding of the nanoplates is observed. As surprisingly shown herein, the $Cs_2AgInCl_6$ nanoplates have modified physical properties, and improved stability to degradation in comparison to the three-dimensional (3D) cubes, which may be related to the large surface to volume ratio and stabilizing ligands, or to low electron phonon interaction in 2D structures.

The present study further discloses ways for enhancing the optical properties of $Cs_2AgInCl_6$ nanoplates beyond the reported doping scheme, and devise better design rules for brighter emitters and devices based on lead free double perovskites.

We are confident that by developing methods to precisely control strain forces in very thin nanoplate crystals we will be able to achieve significant emission from these materials, which is comparable to the doped system, without the need of alloying or a doping process. This advancement in materials science and engineering of lead-free perovskites will advance their implementation in the already active area of nanomaterials that are used by the electronic industry for display and lighting applications.

There is still much unknown regarding the thermodynamic and kinetic growth and degradation of lead-free perovskite nanocrystal, since this field is at its infancy. Yet, it is clear that the additional surface energy and passivating ligands are stabilizing phases that are not stable otherwise (Ithurria and Dubertret, 2008; Tolbert and Alivisatos, 1994; Swamkar et al., 2016). This has tremendous importance in the context of enhancing structural stability for practical devices.

In one aspect, the present invention thus provides a 2D double perovskite nanomaterial represented by the formula $Cs_2ABX_6$ or $L_4[Cs_2ABX_6]_{n-1}ABX_8$, wherein:

A is a metal ion selected from Ag(I), Au(I), and Cu(I);

B is a metal ion selected from In(III), Bi(III), Sb(III), Fe(III), and Tl(III);

X is a halogen;

L each independently is a ligand of the formula R—COO$^-$ or R—CH$_2$NH$_3$$^+$, or of the formula (R)$_3$—P or (R)$_3$—P=O, wherein R each independently is selected from (C$_2$-C$_{19}$)alkyl, (C$_2$-C$_{19}$)alkenyl, (C$_2$-C$_{19}$)alkynyl, and (C$_6$-C$_{14}$)aryl; and n is an integer of 2-20, i.e., 2, 3, 4, 5, 6, 7, 8, 9, 10, 11, 12, 13, 14, 15, 16, 17, 18, 19, or 20, representing the number of metal-halide octahedral layers present in the nanomaterial.

The 2D double perovskite nanomaterial disclosed herein is represented by the formula Cs$_2$ABX$_6$ or L$_4$[Cs$_2$ABX$_6$]$_{n-1}$ABX$_8$ as defined herein. In this respect, it should be noted that while the first formula represents the double perovskite bulk textbook stoichiometry (akin Elpasolite structure), the second formula is valid for two dimensional structures where the surfaces and specifically the organic ligands on the surface are present.

The term "halogen" as used herein refers to a halogen and includes fluoro, chloro, bromo, and iodo, but it is preferably chloro or bromo.

The term "alkyl" as used herein typically means a linear or branched hydrocarbyl having, e.g., 1-19 carbon atoms and includes methyl, ethyl, n-propyl, isopropyl, n-butyl, sec-butyl, isobutyl, tert-butyl, n-pentyl, isoamyl, 2,2-dimethyl-propyl, n-hexyl, n-heptyl, n-octyl, n-nonyl, n-decyl, n-undecyl, n-dodecyl, n-tridecyl, n-tetradecyl, n-pentadecyl, n-hexadecyl, n-heptadecyl, n-octadecyl, and the like. The terms "alkenyl" and "alkynyl" typically means a linear or branched hydrocarbyl having, e.g., 2-19 carbon atoms and at least one double or triple bond, respectively, and include ethenyl, propenyl, 3-butenyl, 2-ethenylbutyl, 1- and 2-pentenyl, 1-, 2- and 3-hexenyl, 1-, 2-, 3- and 4-heptenyl, 1-, 2-, 3- and 4-octenyl, 1-, 2-, 3- and 4-nonenyl, 1-, 2-, 3-, 4- and 5-decenyl, (E)-octadec-9-enyl, (Z)-octadec-9-enyl, and the like; and propynyl, 2-butynyl, 1- and 2-pentynyl, 1-, 2- and 3-hexynyl, 1-, 2-, 3- and 4-heptynyl, 1-, 2-, 3- and 4-octynyl, 1-, 2-, 3- and 4-nonynyl, 1-, 2-, 3-, 4- and 5-decynyl, and the like.

The term "aryl" as used herein denotes an aromatic carbocyclic group having, e.g., 6-14, carbon atoms consisting of a single ring or multiple rings either condensed or linked by a covalent bond such as phenyl, naphthyl, phenanthryl, and biphenyl.

In certain embodiments, the 2D double perovskite nanomaterial disclosed herein is represented by the formula Cs$_2$ABX$_6$ or L$_4$[Cs$_2$ABX$_6$]$_{n-1}$ABX$_8$, wherein (i) A is Ag(I); and B is In(III), e.g., wherein X is Cl or Br, i.e., wherein said nanomaterial has the formula Cs$_2$AgInCl$_6$ or L$_4$[Cs$_2$AgInCl$_6$]$_{n-1}$AgInCl$_8$, or Cs$_2$AgInBr$_6$ or L$_4$[Cs$_2$AgInBr$_6$]$_{n-1}$AgInBr$_8$, respectively; (ii) A is Ag(I); and B is Bi(III), e.g., wherein X is Cl or Br, i.e., wherein said nanomaterial has the formula Cs$_2$AgBiCl$_6$ or L$_4$[Cs$_2$AgBiCl$_6$]$_{n-1}$AgInCl$_8$, or Cs$_2$AgBiBr$_6$ or L$_4$[Cs$_2$AgBiBr$_6$]$_{n-1}$AgBiBr$_8$, respectively; (iii) A is Ag(I); and B is Sb(III), e.g., wherein X is Cl or Br, i.e., wherein said nanomaterial has the formula Cs$_2$AgSbCl$_6$ or L$_4$[Cs$_2$AgSbCl$_6$]$_{n-1}$AgSbCl$_8$, or Cs$_2$AgSbBr$_6$ or L$_4$[Cs$_2$AgSbBr$_6$]$_{n-1}$AgSbBr$_8$, respectively; (iv) A is Ag(I); and B is Fe(III), e.g., wherein X is Cl or Br, i.e., wherein said nanomaterial has the formula Cs$_2$AgFeCl$_6$ or L$_4$[Cs$_2$AgFeCl$_6$]$_{n-1}$AgFeCl$_8$, or Cs$_2$AgFeBr$_6$ or L$_4$[Cs$_2$AgFeBr$_6$]$_{n-1}$AgFeBr$_8$, respectively; or (v) A is Ag(I); and B is Tl(III), e.g., wherein X is Cl or Br, i.e., wherein said nanomaterial has the formula Cs$_2$AgTlCl$_6$ or L$_4$[Cs$_2$AgTlCl$_6$]$_{n-1}$AgTlCl$_8$, or Cs$_2$AgTlBr$_6$ or L$_4$[Cs$_2$AgTlBr$_6$]$_{n-1}$AgTlBr$_8$, respectively, wherein n represents the number of metal-halide octahedral layers present in said double perovskite nanomaterial.

In other embodiments, the 2D double perovskite nanomaterial disclosed herein is represented by the formula Cs$_2$ABX$_6$ or L$_4$[Cs$_2$ABX$_6$]$_{n-1}$ABX$_8$, wherein (i) A is Au(I); and B is In(III), e.g., wherein X is Cl or Br, i.e., wherein said nanomaterial has the formula Cs$_2$AuInCl$_6$ or L$_4$[Cs$_2$AuInCl$_6$]$_{n-1}$AuInCl$_8$, or Cs$_2$AuInBr$_6$ or L$_4$[Cs$_2$AuInBr$_6$]$_{n-1}$AuInBr$_8$, respectively; (ii) A is Au(I); and B is Bi(III), e.g., wherein X is Cl or Br, i.e., wherein said nanomaterial has the formula Cs$_2$AuBiCl$_6$ or L$_4$[Cs$_2$AuBiCl$_6$]$_{n-1}$AuInCl$_8$, or Cs$_2$AuBiBr$_6$ or L$_4$[Cs$_2$AuBiBr$_6$]$_{n-1}$AuBiBr$_8$, respectively; (iii) A is Au(I); and B is Sb(III), e.g., wherein X is Cl or Br, i.e., wherein said nanomaterial has the formula Cs$_2$AuSbCl$_6$ or L$_4$[Cs$_2$AuSbCl$_6$]$_{n-1}$AuSbCl$_8$, or Cs$_2$AuSbBr$_6$ or L$_4$[Cs$_2$AuSbBr$_6$]$_{n-1}$AuSbBr$_8$, respectively; (iv) A is Au(I); and B is Fe(III), e.g., wherein X is Cl or Br, i.e., wherein said nanomaterial has the formula Cs$_2$AuFeCl$_6$ or L$_4$[Cs$_2$AuFeCl$_6$]$_{n-1}$AuFeCl$_8$, or Cs$_2$AuFeBr$_6$ or L$_4$[Cs$_2$AuFeBr$_6$]$_{n-1}$AuFeBr$_8$, respectively; or (v) A is Au(I); and B is Tl(III), e.g., wherein X is Cl or Br, i.e., wherein said nanomaterial has the formula Cs$_2$AuTlCl$_6$ or L$_4$[Cs$_2$AuTlCl$_6$]$_{n-1}$AuTlCl$_8$, or Cs$_2$AuTlBr$_6$ or L$_4$[Cs$_2$AuTlBr$_6$]$_{n-1}$AuTlBr$_8$, respectively, wherein n represents the number of metal-halide octahedral layers present in said double perovskite nanomaterial.

In further embodiments, the 2D double perovskite nanomaterial disclosed herein is represented by the formula Cs$_2$ABX$_6$ or L$_4$[Cs$_2$ABX$_6$]$_{n-1}$ABX$_8$, wherein (i) A is Cu(I); and B is In(III), e.g., wherein X is Cl or Br, i.e., wherein said nanomaterial has the formula Cs$_2$CuInCl$_6$ or L$_4$[Cs$_2$CuInCl$_6$]$_{n-1}$CuInCl$_8$, or Cs$_2$CuInBr$_6$ or L$_4$[Cs$_2$CuInBr$_6$]$_{n-1}$CuInBr$_8$, respectively; (ii) A is Cu(I); and B is Bi(III), e.g., wherein X is Cl or Br, i.e., wherein said nanomaterial has the formula Cs$_2$CuBiCl$_6$ or L$_4$[Cs$_2$CuBiCl$_6$]$_{n-1}$CuInCl$_8$, or Cs$_2$CuBiBr$_6$ or L$_4$[Cs$_2$CuBiBr$_6$]$_{n-1}$CuBiBr$_8$, respectively; (iii) A is Cu(I); and B is Sb(III), e.g., wherein X is Cl or Br, i.e., wherein said nanomaterial has the formula Cs$_2$CuSbCl$_6$ or L$_4$[Cs$_2$CuSbCl$_6$]$_{n-1}$CuSbCl$_8$, or Cs$_2$CuSbBr$_6$ or L$_4$[Cs$_2$CuSbBr$_6$]$_{n-1}$CuSbBr$_8$, respectively; (iv) A is Cu(I); and B is Fe(III), e.g., wherein X is Cl or Br, i.e., wherein said nanomaterial has the formula Cs$_2$CuFeCl$_6$ or L$_4$[Cs$_2$CuFeCl$_6$]$_{n-1}$CuFeCl$_8$, or Cs$_2$CuFeBr$_6$ or L$_4$[Cs$_2$CuFeBr$_6$]$_{n-1}$CuFeBr$_8$, respectively; or (v) A is Cu(I); and B is Tl(III), e.g., wherein X is Cl or Br, i.e., wherein said nanomaterial has the formula Cs$_2$CuTlCl$_6$ or L$_4$[Cs$_2$CuTlCl$_6$]$_{n-1}$CuTlCl$_8$, or Cs$_2$CuTlBr$_6$ or L$_4$[Cs$_2$CuTlBr$_6$]$_{n-1}$CuTlBr$_8$, respectively, wherein n represents the number of metal-halide octahedral layers present in said double perovskite nanomaterial.

In certain embodiments, L each independently is a ligand of the formula R—COO$^-$ or R—CH$_2$NH$_3$$^+$, wherein R each independently is (C$_2$-C$_{19}$)alkenyl such as CH$_3$—(CH$_2$)$_7$—CH=CH—(CH$_2$)$_7$—, i.e., a negatively charged oleic acid or a positively charged oleylamine, respectively. In other embodiments, L each independently is a ligand of the formula (R)$_3$—P or (R)$_3$—P=O, wherein R each independently is (C$_2$-C$_{19}$)alkyl such as octyl, i.e., trioctylphosphine or trioxtylphosphine oxide, respectively.

In certain embodiments, the 2D double perovskite nanomaterial disclosed herein, according to any one of the embodiments above, has the shape of a nanoplate, more specifically a colloidal nanoplate, or a larger nanosheet.

The term "nanoplate" as used herein refers to a 2D nanostructure arranged as a single- or multiple-layer of unit cells, which has an external dimension in the nanometer range and two other external dimensions that are significantly larger. Particular such nanoplates have a disc- or disc-like—(e.g., square or rectangular) shape having a diameter or lateral dimensions each usually not less than about 8 or 10 nm, and up to about 50, 55 or 60 nm, and a thickness of 1-5 unit cells, i.e., of up to about 10 nm.

The term "nanosheet" as used herein refers to a 2D nanostructure arranged as a single- or multiple-layer of unit cells, which is larger than a nanoplate, but like a nanoplate has an external dimension in the nanometer range and two other external dimensions that are significantly larger. Particular such nanosheets may have a disc- or disc-like—(e.g., square or rectangular) shape, and have a diameter or lateral dimensions each usually not less than about 45, 50 or 55 nm, and up to about 1000, 1200, 1400, or 1500 nm, and a thickness of 1-10 unit cells, i.e., of up to about 20 nm.

The term "unit cell" as used herein with respect to the 2D double perovskite nanomaterial of the present invention refers to the most basic, i.e., smallest, repeating unit of the nanomaterial crystal lattice, which includes all components of the formula $Cs_2ABX_6$ or $L_4[Cs_2ABX_6]_{n-1}ABX_8$, i.e., each one of the three metals (cesium, metal A, and metal B), halogen and ligands, and may further referred to as the building block of said crystal lattice.

In contrast, the metal-halide octahedral layer referred to herein includes all said components except for cesium (thus may be represented by the formula $L_4[Cs_2ABX_6]_{n-1} ABX_8$ wherein n is 1), and as shown herein, upon addition of cesium will form nanoplates of said 2D double perovskite nanomaterial.

In particular embodiments, the 2D double perovskite nanomaterial disclosed herein has the shape of a disc- or disc-like—(e.g., square or rectangular) nanoplate having a diameter or lateral dimensions each of about 10-50 nm, e.g., about 15-45 nm, about 20-40 nm, or about 25-35 nm, and a thickness of about 1-10 nm, e.g., about 2-8, or 3-6 nm; or said nanomaterial has the shape of a disc- or disc-like—(e.g., square or rectangular) nanosheet having a diameter or lateral dimensions each of about 50-1500 nm, e.g., about 60-1400, 70-1300, 80-1200, 90-1100, or 100-1000 nm, and a thickness of about 1-20 nm, e.g., about 2-18, 3-16, 4-14, 5-12, or 6-10 nm.

In another aspect, the present invention provides a light emitting material, e.g., a semiconductor material or a high energy x-ray or gamma-ray scintillator, comprising a 2D double perovskite nanomaterial represented by the formula $Cs_2ABX_6$ or $L_4[Cs_2ABX_6]_{n-1}ABX_8$, as defined in any one of the embodiments above. Particular such double perovskite nanomaterials are those wherein A is Ag(I) and B is In(III), Bi(III), Sb(III), Fe(III), or Tl(III); A is Au(I) and B is In(III), Bi(III), Sb(III), Fe(III), or Tl(III); or A is CuAg(I) and B is In(III), Bi(III), Sb(III), Fe(III), or Tl(III). In more particular such light emitting materials, said double perovskite nanomaterial is represented by the formula $Cs_2AgInX_6$ or $L_4[Cs_2AgInX_6]_{n-1}AgInX_8$, wherein X is Cl or Br, and n represents the number of metal-halide octahedral layers present in said nanomaterial. Examples of such nanomaterials are those wherein L each independently is a ligand of the formula R—COO$^-$ or R—CH$_2$NH$_3^+$, wherein R each independently is $(C_2\text{-}C_{19})$alkenyl, such as a negatively charged oleic acid or a positively charged oleylamine, respectively, or a ligand of the formula $(R)_3$—P or $(R)_3$—P=O, wherein R each independently is $(C_2\text{-}C_{19})$alkyl, such as trioctylphosphine or trioxtylphosphine oxide, respectively.

Semiconductor materials are nominally small band gap insulators, and the most commonly used semiconductor materials are crystalline inorganic solids. In many cases, and as shown in the art, the conductivity or light emission efficiency of semiconductor material can be improved by doping, i.e., by adding an impurity element.

Scintillators are materials that are able to convert high energy radiation such as X-rays or gamma-rays to a near visible or visible light. They are widely used as detectors in medical diagnostics, high energy physics and geophysical exploration. Scintillators can be gaseous, liquid or solid, organic or inorganic (glass, single crystal, ceramics). Detectors based on scintillators are essentially composed of a scintillator material, and a photodetector that can be either a photomultiplier tube (PMT) or a photodiode. The role of the photodetector is to convert the outcoming light of the scintillator to an electrical signal.

In a further aspect, the invention provides an electronic-, optic-, or optoelectronic device comprising, as a semiconductor material or scintillator, a 2D double perovskite nanomaterial represented by the formula $Cs_2ABX_6$ or $L_4[Cs_2ABX_6]_{n-1}ABX_8$, as defined in any one of the embodiments above. Particular such double perovskite nanomaterials are those wherein A is Ag(I) and B is In(III), Bi(III), Sb(III), Fe(III), or Tl(III); A is Au(I) and B is In(III), Bi(III), Sb(III), Fe(III), or Tl(III); or A is CuAg(I) and B is In(III), Bi(III), Sb(III), Fe(III), or Tl(III). In more particular such light emitting materials, said double perovskite nanomaterial is represented by the formula $Cs_2AgInX_6$ or $L_4[Cs_2AgInX_6]_{n-1}AgInX_8$, wherein X is Cl or Br, and n represents the number of metal-halide octahedral layers present in said nanomaterial. Examples of such nanomaterials are those wherein L each independently is a ligand of the formula R—COO$^-$ or R—CH$_2$NH$_3^+$, wherein R each independently is $(C_2\text{-}C_{19})$alkenyl, such as a negatively charged oleic acid or a positively charged oleylamine, respectively, or a ligand of the formula $(R)_3$—P or $(R)_3$—P=O, wherein R each independently is $(C_2\text{-}C_{19})$alkyl, such as trioctylphosphine or trioxtylphosphine oxide, respectively.

Non-limiting examples of electronic, optic-, or optoelectronic devices include a light emitting diode (LED) such as white LED, display device, light detector, X-ray detector, gamma-ray detector, and imaging detector such as a medical imaging detector.

LED is a semiconductor light source that emits light when current flows through it. Electrons in the semiconductor recombine with electron holes, releasing energy in the form of photons. The color of the light (corresponding to the energy of the photons) is determined by the energy required for electrons to cross the band gap of the semiconductor.

A display devise is an output device for presentation of information in visual or tactile form. When the input information that is supplied has an electrical signal the display is called an electronic display.

Light detector is a device used in an optical transmission system to detect an optical signal generated by a light source and propagating through a medium. A light detector essentially is an optical receiver that is paired with an optical transmitter, both of which are connected to electrically based devices or systems. So, the source converts electrons to photons and the detector converts photons to electrons. Different types of light detectors include light dependent resistors (LDRs), photo diodes, photo transistors, and the like, and they are called photoelectric devices since they convert light energy to electric energy. The light detectors can detect different types of light such as visible light, ultraviolet light, infrared light, and the like.

X-ray detectors are devices used to measure the flux, spatial distribution, spectrum, and/or other properties of x-rays. Some of the common x-ray detectors include proportional counters, microchannel plates, and semiconductor detectors.

Gamma-ray detectors measure electromagnetic radiation through the process of the counting and measuring the energy of individual photons emitted from elements. Different types of detectors are used for detecting gamma rays, the most common are scintillation detectors and semiconductors.

Imaging detector (also referred to as image sensor or imager) is a sensor that detects and conveys information used to make an image by converting variable attenuation of light waves (as they pass through or reflect off objects) into signals, small bursts of current that convey the information. Imaging detectors, such as x-ray detectors, can be used in medical imaging equipment.

In yet another aspect, the present invention relates to a process (also referred to herein as "process A") for the preparation of a 2D double perovskite nanomaterial represented by the formula $Cs_2ABX_6$ or $L_4[Cs_2ABX_6]_{n-1}ABX_8$, wherein A is a metal ion selected from the group consisting of Ag(I), Au(I), and Cu(I); B is a metal ion selected from the group consisting of In(III), Bi(III), Sb(III), Fe(III), and Tl(III); X is a halogen; L each independently is a ligand of the formula $R-COO^-$ or $R-CH_2NH_3^+$, or of the formula $(R)_3-P$ or $(R)_3-P=O$, wherein R each independently is selected from the group consisting of $(C_2-C_{19})$alkyl, $(C_2-C_{19})$alkenyl, $(C_2-C_{19})$alkynyl, and $(C_6-C_{14})$aryl; and n is an integer of 2 to 20, representing the number of metal-halide octahedral layers present in the nanomaterial, said process comprising:
 (i) mixing a salt of metal ion A (also referred to herein as "metal ion A salt"), a salt of metal ion B (also referred to herein as "metal ion B salt"), and either a cesium salt or a source of said halogen, in a solvent, in the presence of an acid-base couple comprising (a) a mixture of an acid of the formula R—COOH and a base of the formula $R-CH_2NH_2$; or (b) an acid of the formula $(R)_3-P=O$ and a base of the formula $(R)_3-P$;
 (ii) optionally heating the mixture obtained in (i) to a temperature of up to about 100° C., i.e., to a temperature above room temperature and up to about 40° C., 50° C., 60° C., 70° C., 80° C., 70° C. 90° C., or about 100° C.; and
 (iii) introducing, e.g., by rapidly injecting, a nucleation initiator into the reaction mixture obtained in (ii) to thereby initiate assembly of said 2D double perovskite nanomaterial,
 provided that:
 (a) when said cesium salt is included within the salts mixed in step (i), said nucleation initiator is a benzyl halide of the formula $C_6H_5-C(O)-X$, and the introduction of said nucleation initiator is followed by cooling of the reaction mixture, when necessary, to room temperature, to thereby obtain said 2D double perovskite nanomaterial in said solvent; and
 (b) when said cesium salt is not included within the salts mixed in step (ii), said nucleation initiator is a compound of the formula Cs—R, and the introduction of said nucleation initiator is preceded by cooling the reaction mixture, when necessary, to room temperature, to thereby obtain said 2D double perovskite nanomaterial in said solvent.

In certain embodiments, the metal salts mixed in a solvent in step (i) of process A, i.e., said metal ion A salt, said metal ion B salt, and optionally said cesium salt, each independently is the acetate, chloride, bromide, nitrate, mesylate, maleate, fumarate, tartrate, p-toluenesulfonate, benzenesulfonate, benzoate, phosphate, sulfate, citrate, carbonate, or succinate salt.

In certain embodiments, the solvent in which the metal salts are mixed in step (i) of process A is a non-coordinating solvent, e.g., a non-polar non-coordinating solvent such as o-xylene, m-xylene, p-xylene, toluene, hexane, heptane, ethylbenzene, benzene, octadecene, or a combination thereof. In particular embodiments such as those exemplified herein, said solvent is o-xylene or octadecene.

The term "acid-base couple" as used herein with respect to process A refers, in certain embodiments, to a mixture/combination of (i) an organic acid, more specifically a fatty acid of the formula R—COOH; and (ii) a base, more specifically an organic amine of the formula $R-CH_2NH_2$, wherein R each independently is a saturated or unsaturated aliphatic hydrocarbon moiety selected from $(C_2-C_{19})$alkyl, $(C_2-C_{19})$alkenyl, and $(C_2-C_{19})$alkynyl, i.e., a hydrocarbyl optionally containing one or more double and/or triple bonds. In particular embodiments, R each independently is the same or different $(C_2-C_{19})$alkenyl. In a more particular embodiment, R is $CH_3-(CH_2)_7-CH=CH-(CH_2)_7-$, and the acid-base couple is thus a mixture of oleic acid and oleylamine. In other embodiments, the term "acid-base couple" refers to a mixture/combination of a phosphine of the formula $(R)_3-P$ and a phosphine oxide of the formula $(R)_3-P=O$, wherein R each independently is a hydrocarbyl optionally containing one or more double and/or triple bonds, or a $(C_6-C_{14})$aryl. In particular embodiments, R each independently is the same or different $(C_2-C_{19})$alkyl, or $(C_6)$aryl. In more particular embodiments, R is octyl or phenyl, and the acid-base couple is thus a mixture of trioctylphosphine and trioxtylphosphine oxide, or a mixture of triphenylphosphine and triphenylphosphine oxide.

The acid and base constituting said acid-base couple are also referred to herein as "organic ligands" or "ligands". These ligands contain aliphatic moieties and are highly soluble in non-polar solvents. Their complexation with ionic salts forms the precursors that enable the growth of the 2D double perovskite nanocrystals. The ligands usually also remain on the surface of the 2D double perovskite nanocrystals keeping the products form aggregation when in the solution. Post synthesis, most of those ligands are left in the solvent and removed following precipitation of the nanomaterial from the product obtained in step (iii).

According to process A, the three metals salts, i.e., metal ion A salt, metal ion B salt, and cesium salt, may be mixed in a solvent, in the presence of an acid-base couple as defined above, and a benzoyl halide is then introduced into the reaction mixture, as a nucleation initiator, so as to induce assembly of the double perovskite nanomaterial. Alternatively, metal ion A salt, metal ion B salt, and a source of a halogen are mixed together in a solvent, in the presence of an acid-base couple as defined above, and a compound of the formula Cs—R, wherein R is selected from $(C_2-C_{19})$alkyl, $(C_2-C_{19})$alkenyl, $(C_2-C_{19})$alkynyl, and $(C_6-C_{14})$aryl, is then introduced into the reaction mixture, as a nucleation initiator, so as to induce assembly of the double perovskite nanomaterial.

The term "halogen source" as used herein with respect to process A refers to any molecule capable of providing the halogen required for the assembly of the double perovskite nanomaterial. Such a halogen source may be, e.g., a halogen acid (a compound of the formula HX) such as HCl and HBr, a benzoyl halide of the formula $C_6H_5$—C(O)—X such as benzoyl chloride and benzoyl bromide, alkyl halide (a compound of the formula alkyl-X), alkenyl halide (a compound of the formula alkenyl-X), or alkynyl halide (a compound of the formula alkynyl-X), wherein X represents said halogen.

The molar ratios between the metal salts mixed in step (i) of process A are determined according to the stoichiometric ratios between said metals in the double perovskite nanomaterial prepared. Yet, in certain cases, additional parameters such as the solubility of a particular metal salt used should be taken into consideration. In a particular process exemplified herein, cesium acetate, silver acetate, and indium acetate are mixed in step (i) in o-xylene, and the molar ratio between said salts is about 1:2:2, respectively. In a different process exemplified herein, silver nitrate, indium chloride, and a halogen source are in step (i) in octadecene, and the molar ratio between said silver salt and indium salt was about 2:1 taking into consideration the solubility of silver nitrate in the reaction solution that is lower than that of indium chloride.

In certain embodiments, the invention relates to a process for the preparation of a 2D double perovskite nanomaterial represented by the formula $Cs_2ABX_6$ or $L_4[Cs_2ABX_6]_{n-1}ABX_8$, according to any one of the embodiments above, wherein metals A and B are Ag(I) and In(III), respectively, wherein X is a halogen such as Cl and Br, preferably Cl; L each independently is a ligand as defined above; and n represents the number of metal-halide octahedral layers present in the nanomaterial. In certain particular such embodiments, the cesium salt, silver salt, and indium salt (e.g., cesium acetate, silver acetate and indium acetate) are all mixed in a solvent in step (i). In other particular such embodiments, the silver salt and indium salt (e.g., silver nitrate and indium chloride) are mixed in step (i) with said halogen source, preferably with a halogen acid such as HCl and HBr, or a benzoyl halide such as benzoyl chloride and benzoyl bromide.

In certain embodiments, the acid-base couple used in step (i) of process A comprises, or consists of, a mixture of oleic acid and oleylamine (R—COOH and R—$CH_2NH_2$, respectively, wherein R is $CH_3(CH_2)_7CH=CH(CH_2)_7$—). In certain particular such embodiments, the cesium salt is included within the salts mixed in step (i), and the ratio between the oleic acid and the oleylamine present in said acid-base couple is about 3:1, respectively, by volume. In other particular such embodiments, the cesium salt is not included within the salts mixed in step (i); and the ratio between said oleic acid and oleylamine present in step (i) is about 1:1 by volume.

According to process A, in cases wherein a cesium salt is not included within the salts mixed in step (i), the introduction of the nucleation initiator is preceded by cooling the reaction mixture, when necessary, to room temperature, to thereby obtain said 2D double perovskite nanomaterial in said solvent. On the other hand, in cases wherein the cesium salt is included within the salts mixed in step (i), the introduction of the nucleation initiator is followed by cooling of the reaction mixture, when necessary, to room temperature, to thereby obtain said 2D double perovskite nanomaterial in said solvent. In particular such cases, said cooling step is performed, i.e., starts, several seconds and no more than 3 minutes after step (iii), e.g., about 10 seconds, 20 seconds, 30 seconds, 40 seconds, 50 seconds, 60 seconds, 90 seconds, 120 seconds, 150 seconds, or 180 seconds after step (iii), e.g., using a cold-water bath.

In some particular embodiments, the perovskite nanomaterial prepared by process A is represented by the formula $Cs_2AgInCl_6$ or $L_4[Cs_2ABCl_6]_{n-1}ABCl_8$, wherein L each independently is negatively charged oleic acid or positively charged oleylamine; and n is an integer of 2 to 20, e.g., 2-10, representing the number of metal-chloride octahedral layers present in the nanomaterial, said process comprising:
  (i) mixing cesium acetate, silver acetate, and indium(III) acetate at a molar ratio of about 1:2:2, respectively, in a solvent, in the presence of an acid-base couple comprising a mixture of oleic acid and oleylamine at a ratio of about 3:1, respectively, by volume;
  (ii) heating the mixture obtained in (i) to a temperature of about 70° C.;
  (iii) rapidly injecting benzoyl chloride into the reaction mixture obtained in (ii), wherein the molar ratio of the benzoyl chloride to the cesium salt mixed in step (i) is about 6:1, respectively; and
  (iv) cooling the reaction mixture obtained in step (iii) to room temperature, within several seconds and not more than 3 minutes after step (iii), optionally using a cold-water or ice bath, to thereby obtain said 2D double perovskite nanomaterial in said solvent.

In other particular embodiments, the perovskite nanomaterial prepared by process A is represented by the formula $Cs_2AgInCl_6$ or $L_4[Cs_2ABCl_6]_{n-1}ABCl_8$, wherein L each independently is negatively charged oleic acid or positively charged oleylamine; and n is an integer of 2 to 20, e.g., 2-10, representing the number of metal-chloride octahedral layers present in the nanomaterial, said process comprising:
  (i) mixing silver nitrate and indium(III) chloride at a molar ratio of about 2:1, respectively, in a solvent, in the presence of HCl and an acid-base couple comprising a mixture of oleic acid and oleylamine at a ratio of about 1:1, by volume;
  (ii) heating the mixture obtained in (i) to a temperature of about 100° C.;
  (iii) cooling the reaction mixture obtained in step (ii) to room temperature, optionally using a cold-water or ice bath; and
  (iv) injecting cesium oleate into the reaction mixture obtained in (iii), wherein the molar ratio of the cesium oleate to the silver salt mixed in step (i) is about 1:2.5, respectively, to thereby obtain said 2D double perovskite nanomaterial in said solvent.

In certain embodiments, process A, according to any one of the embodiments above, further comprises a step for precipitating the 2D double perovskite nanomaterial obtained from said solvent. Such a precipitation step may be carried out by any suitable technology, e.g., by centrifugation.

The 2D double perovskite nanomaterial prepared by process A, according to any one of the embodiments above, may have the shape of a nanoplate, e.g., a disc- or disc-like— (e.g., square or rectangular) nanoplate. In particular embodiments, said nanoplates have a diameter or lateral dimensions each of about 10-50 nm, e.g., about 15-45 nm, about 20-40 nm, or about 25-35 nm, and a thickness of about 1-10 nm, e.g., about 2-8 nm, about 3-6 nm, or about 5 nm.

In still another aspect, the present invention relates to a process (also referred to herein as "process B") for the preparation of a 2D double perovskite nanomaterial represented by the formula $Cs_2ABX_6$ or $L_4[Cs_2ABX_6]_{n-1}ABX_8$, wherein A is a metal ion selected from the group consisting of Ag(I), Au(I), and Cu(I); B is a metal ion selected from the group consisting of In(III). Bi(III), Sb(III), Fe(III), and Tl(III); X is a halogen, preferably Cl; L each independently is a ligand of the formula R—COO$^-$ or R—CH$_2$NH$_3$—, or of the formula (R)$_3$—P or (R)$_3$—P=O, wherein R each independently is selected from (C$_2$—Cig)alkyl, (C$_2$-C$_{19}$)alkenyl, (C$_2$-C$_{19}$)alkynyl, and (C$_6$-C$_{14}$)aryl; n is an integer of 2 to 20, representing the number of metal-halide octahedral layers present in the nanomaterial; and said nanomaterial has the shape of a nanosheet, said process comprising:
(i) providing a solution of a double perovskite nanomaterial represented by the formula Cs$_2$ABX$_6$ or L$_4$[Cs$_2$ABX$_6$]$_{n-1}$ABX$_8$ in a solvent, wherein said nanomaterial is either a three-dimensional (3D) material having the shape of nanocubes or a 2D material having the shape of nanoplates;
(ii) evaporating said solvent, in a controlled manner, to thereby allow self-assembly of a solid array of said double perovskite nanomaterial; and
(iii) recrystallizing (fusing) said solid array with either chemical or physical means to thereby obtain said 2D double perovskite nanomaterial.

It is postulated that the 2D double perovskite nanosheets prepared by process B are obtained due to the removal/washing of excess of ligands used in the preparation of, and remained adhered to/embedded within, the 2D nanoplates or 3D nanocubes used as the starting material for the preparation of said nanosheets. According to this process, the ligands that have been used for the formation of the 2D double perovskite nanoplates (e.g., the oleic acid and oleylamine used in process A exemplified herein) or 3D nanocubes are removed/washed in step (ii), which is performed optionally repeatedly (in order to sufficiently remove the excess of ligands) and includes (in each cycle) evaporating said solvent from the solution, in a controlled manner, to thereby allow self-assembly of a solid array of said double perovskite nanomaterial, followed by recrystallization of said solid array to thereby obtain said 2D double perovskite nanomaterial.

In certain embodiments, evaporating said solvent, in a controlled manner, in step (ii) of process B comprises precipitating the solution (e.g., by centrifugation) and then removing the liquid phase to thereby obtain a solid material, and re-dissolving said solid material in a solvent to thereby remove/wash excess of ligands from said solid material. Such a step (precipitating the solution and redissolving the solid material) may be repeated at least twice, e.g., 2, 3, 4, or more times, so as to remove as much ligands as possible and consequently enable the formation and growing of the nanosheet. It should be understood that in case step (ii) is performed more than once, the solution precipitated in the first cycle is the one provided in step (i), and the solution precipitated in each one of the following cycles is the one obtained at the end of the preceding cycle.

According to process B, the recrystallization step (iii) required so as to obtain said 2D double perovskite nanomaterial may be performed by either chemical or physical means. In certain embodiments, said recrystallization is performed by physical means, and comprises aging the solid material obtained in step (ii) at room temperature for a time period of between about 24 hours to about 7 days. In other embodiments, said recrystallization is performed by physical means, and comprises heating the solid material obtained in step (ii) to about 180° C. for about 30 seconds under inert environment. In further embodiments, said recrystallization is performed by physical means, and comprises oxygen plasma treatment of said solid material, e.g., three times or more, each time for about 3 seconds.

Solvents for use according to process B are those referred to with respect to process A, and include non-coordinating solvents such as o-xylene, m-xylene, p-xylene, toluene, hexane, heptane, ethylbenzene, benzene, octadecene, and any combination thereof.

The 2D double perovskite nanomaterial prepared by process B, according to any one of the embodiments above, may have a diameter or lateral dimensions of about 50-1500 nm, e.g., about 50-1000 nm, about 60-1100 nm, about 70-1200 nm, about 80-1300 nm, or 90-1400 nm, and a thickness of about 5-20 nm, e.g., about 10-15 nm.

In yet a further aspect, the invention provides a double perovskite building block represented by the formula L$_4$ABX$_8$, wherein:
A is a metal ion selected from the group consisting of Ag(I), Au(I), and Cu(I);
B is a metal ion selected from the group consisting of In(III), Bi(III), Sb(III), Fe(III), and Tl(III);
X is a halogen; and
L each independently is a ligand of the formula R—COO$^-$ or R—CH$_2$NH$_3$$^+$, or of the formula (R)$_3$—P or (R)$_3$—P=O, wherein R each independently is selected from the group consisting of (C$_2$-C$_{19}$)alkyl, (C$_2$-C$_{19}$)alkenyl, (C$_2$-C$_{19}$)alkynyl, and (C$_6$-C$_{14}$)aryl.

In certain embodiments, the double perovskite building block disclosed herein is represented by the formula L$_4$ABXS, wherein (i) A is Ag(I); and B is In(III), e.g., wherein X is Cl or Br, i.e., wherein said building block has the formula L$_4$AgInCl$_8$ or L$_4$AgInBr$_8$, respectively; (ii) A is Ag(I); and B is Bi(III), e.g., wherein X is Cl or Br, i.e., wherein said building block has the formula L$_4$AgBiCl$_8$ or L$_4$AgBiBr$_8$, respectively; (iii) A is Ag(I); and B is Sb(III), e.g., wherein X is Cl or Br, i.e., wherein said building block has the formula L$_4$AgSbCl$_8$ or L$_4$AgSbBr$_8$, respectively; (iv) A is Ag(I); and B is Fe(III), e.g., wherein X is Cl or Br, i.e., wherein said building block has the formula L$_4$AgFeCl$_8$ or L$_4$AgFeBr$_8$, respectively; or (v) A is Ag(I); and B is Tl(III), e.g., wherein X is Cl or Br, i.e., wherein said building block has the formula L$_4$AgTlCl$_8$ or L$_4$AgTlBr$_8$, respectively.

In other embodiments, the double perovskite building block disclosed herein is represented by the formula L$_4$ABX$_8$, wherein (i) A is Au(I); and B is In(III), e.g., wherein X is Cl or Br, i.e., wherein said building block has the formula L$_4$AuInCl$_8$ or L$_4$AuInBr$_8$, respectively; (ii) A is Au(I); and B is Bi(III), e.g., wherein X is Cl or Br. i.e., wherein said building block has the formula L$_4$AuBiCl$_8$ or L$_4$AuBiBr$_8$, respectively; (iii) A is Au(I); and B is Sb(III), e.g., wherein X is Cl or Br, i.e., wherein said building block has the formula L$_4$AuSbCl$_8$ or L$_4$AuSbBr$_8$, respectively; (iv) A is Au(I); and B is Fe(III), e.g., wherein X is Cl or Br, i.e., wherein said building block has the formula L$_4$AuFeCl$_8$ or L$_4$AuFeBr$_8$, respectively; or (v) A is Au(I); and B is Tl(III), e.g., wherein X is Cl or Br, i.e., wherein said building block has the formula L$_4$AuTlCl$_8$ or L$_4$AuTlBr$_8$, respectively.

In further embodiments, the double perovskite building block disclosed herein is represented by the formula L$_4$ABXS, wherein (i) A is Cu(I); and B is In(III), e.g., wherein X is Cl or Br, i.e., wherein said building block has the formula L$_4$CuInCl$_8$ or L$_4$CuInBr$_8$, respectively; (ii) A is Cu(I); and B is Bi(III), e.g., wherein X is Cl or Br, i.e., wherein said building block has the formula L$_4$CuBiCl$_k$ or L$_4$CuBiBr$_8$, respectively; (iii) A is Cu(I); and B is Sb(III), e.g., wherein X is Cl or Br, i.e., wherein said building block has the formula L$_4$CuSbCl$_8$ or L$_4$CuSbBr$_8$, respectively; (iv) A is Cu(I); and B is Fe(III), e.g., wherein X is Cl or Br, i.e., wherein said building block has the formula $L_4CuFeCl_8$ or $L_4CuFeBr_8$, respectively, or (v) A is Cu(I); and B is Tl(III), e.g., wherein X is Cl or Br. i.e., wherein said building block has the formula $L_4CuTlCl_8$ or $L_4CuTlBr_8$, respectively.

In certain embodiments, the ligands Ls composing the double perovskite building block disclosed herein, according to any one of the embodiments above, are each independently of the formula R—COO$^-$ or R—CH$_2$NH;*, wherein R each independently is ($C_2$-$C_{19}$)alkenyl such as $CH_3$—$(CH_2)_7$—CH=CH—$(CH_2)_7$—, i.e., a negatively charged oleic acid or a positively charged oleylamine, respectively. In other embodiments, said ligands are of the formula (R)$_3$—P or (R)$_3$—P=O, wherein R each independently is ($C_2$-$C_{19}$)alkyl, such as octyl, or phenyl.

As shown herein, the double perovskite building block disclosed can be used as a starting material for the preparation of a 2D double perovskite nanomaterial represented by the formula $Cs_2ABX_6$ or $L_4[Cs_2ABX_6]_{n-1}ABX_8$ as defined above, by mixing said building block with cesium so as to obtain a bilayer or a thicker structure, followed by heating the reaction mixture to thereby induce formation of the 2D double perovskite nanomaterial.

In still a further aspect, the invention thus relates to a process (also referred to herein as "process C") for the preparation of a 2D double perovskite nanomaterial represented by the formula $Cs_2ABX_6$ or $L_4[Cs_2ABX_6]_{n-1}ABX_8$, wherein A is a metal ion selected from the group consisting of Ag(I), Au(I), and Cu(I); B is a metal ion selected from the group consisting of In(III), Bi(III), Sb(III), Fe(III), and Tl(III); X is a halogen; L each independently is a ligand of the formula R—COO$^-$ or R—CH$_2$NH$_3^+$, or of the formula (R)$_3$—P or (R)$_3$—P=O, wherein R each independently is selected from the group consisting of ($C_2$-$C_{19}$)alkyl, ($C_2$-$C_{19}$)alkenyl, ($C_2$-$C_{19}$)alkynyl, and ($C_6$-$C_{14}$)aryl; and n is an integer of 2 to 20, representing the number of metal-halide octahedral layers present in the nanomaterial, said process comprising:
  (i) mixing a double perovskite building block according to any one of the embodiments above and a cesium salt in a solvent;
  (ii) heating the mixture obtained in (i) to a temperature of, e.g., from about 80° C. to about 120° C.; and
  (iii) introducing a cesium salt into said solvent to thereby initiate assembly of said 2D double perovskite nanomaterial.

In certain embodiments, the cesium salt mixed with said double perovskite building block in step (i) of process C is the acetate, chloride, bromide, nitrate, mesylate, maleate, fumarate, tartrate, p-toluenesulfonate, benzenesulfonate, benzoate, phosphate, sulfate, citrate, carbonate, or succinate salt.

Solvents for use according to process C are those referred to with respect to processes A and B, and include non-coordinating solvents such as o-xylene, m-xylene, p-xylene, toluene, hexane, heptane, ethylbenzene, benzene, octadecene, and any combination thereof.

Unless otherwise indicated, all numbers expressing, e.g., dimensions such as diameters, lateral dimensions, and thickness, molar/volume ratios, and temperatures, used in this specification, are to be understood as being modified in all instances by the term "about". Accordingly, unless indicated to the contrary, the numerical parameters set forth in this specification are approximations that may vary by up to plus or minus 10% depending upon the desired properties to be obtained by the present invention.

The invention will now be illustrated by the following non-limiting Examples.

EXAMPLES

Study 1. The Role Silver Nanoparticles Plays in Silver-Based Double-Perovskite Nanocrystals Materials. Benzoyl chloride (99.9%, Alfa Aesar), cesium Acetate (99.9%, Aldrich), indium (III) acetate (99.99%, Aldrich), oleic acid (90%, Aldrich), oleylamine (70%, Aldrich), silver acetate (99.99%, Aldrich), o-xylene anhydrous (97%, Aldrich) and hexane (97%, Aldrich). All chemicals were used as purchased without further purification.

Synthesis of $Cs_2AgInCl_6$ nanocrystals. In a typical synthesis, 25 mg (0.125 mmol) of cesium acetate, 40 mg (0.25 mmol) of silver acetate, and 80 mg (0.25 mmol) of indium (III) acetate were placed into a 20 mL glass vial with a magnetic stirring bar. O-xylene (5 mL), oleic acid (1.25 mL) and oleylamine (0.375 mL) were added, and the vial was heated to 100° C. for the desired amount of time. Benzoyl chloride (0.200 mL, 1.5 mmol) was injected quickly. Then, the vials were taken out of the oil bath and left to cool to room temperature or quenched in water bath. For measurements, the nanocrystal reaction mixture was precipitated by centrifugation at 12,000 rpm for 10 min. The solution was discarded, and the resulting pellet was redispersed in hexane.

UV-vis absorption, PL and excitation measurements (PLE). For optical measurements, 200 μL of the sample solution was injected to a 96 well microplate or 200 mL of the sample solution for Take-3 quartz cuvette and measured in a Synergy H1 hybrid multi-mode reader. The samples were irradiated using xenon lamp (Xe900).

Transmission electron microscopy (TEM) characterization. One drop of dilute nanocrystal solution in hexane (1:20 dilution) was cast onto a TEM grid (carbon film only on 300 mesh copper grid or ultrathin carbon film on holey carbon support film, 400 mesh copper grid). The samples were observed in TEM mode with a Thermo Fisher/FEI Tecnai $G^2$ T20 S-Twin LaB$_6$ TEM operated at 200 KeV, with a 1K×1K Gatan 694 slow scan CCD. High resolution imaging, diffraction patterns acquisition and chemical mapping was done in a Thermo Fisher/FEI Titan-Themis double Cs-corrected HR—S/TEM, operated at 200 kV and equipped with a Ceta2 4K×4K camera (for TEM mode) and a Bruker Dual-X EDX detectors for STEM-EDX chemical mapping. The high-resolution STEM micrographs were acquired using a high-angle annular dark field (HAADF) STEM detector with collection angle range of 93°-200° mrad and beam convergence of 21° mrad. Tilts of 0° (base state), 44° and 50° were performed with a camera length of 115 mm. The STEM-EDX measurement were acquired and analyzed using the Thermo Fisher Velox software.

X-ray diffraction. The nanocrystal solution in hexane was drop-cast onto a glass substrate (rectangular micro slides, 76×26 [mm]) and the X-ray beam focused on the resulting film. Measurements were taken using a Rigaku Smart-Lab 9 kW high-resolution X-ray diffractometer, equipped with a rotating anode X-ray source. We use a "Glancing mode" (grazing angle) method (2-theta), which is suitable for measuring thin films, with 1.54 Å (Cu Kα) wavelength. The X-rays source was fixed on ω=0.4° and the detector move on the range of 2θ=20°-90°.

X-ray photoelectron spectroscopy (XPS) characterization. A few drops of nanocrystal solution in hexane was cast onto a clean gold substrate. X-ray photoelectron spectroscopy (XPS) measurements were performed in an analysis chamber (UHV—210-10 torr during analysis) using a Versaprobe III—PHI Instrument (PHI, USA). The sample was irradiated with a Focused X-Ray Al-Kα monochromated X-rays source (1486.6 eV) using X-ray beam size diameter: 200 microns, 25 W, 15 kV. The out coming photoelectrons are directed to a Spherical Capacitor Analyzer (SCA). The sample charging was compensated by a Dual Beam charge neutralization based on a combination of a traditional electron flood gun and a low energy argon ion beam. Survey spectra are presented as a plot of the number of photoelectron (units: counts/sec) measured as a function of the binding energy (units: eV). The survey spectra were collected with a pass energy of 140 eV and a step size of 0.5 eV. The core level binding energies of the different peaks were normalized by setting the binding energy for the C1s at 284.8 eV.

UV-vis Irradiation photochemical activated Ostwald ripening experiment. The same procedure for synthesis of $Cs_2AgInCl_6$ nanocrystals was conducted but under dark conditions. Then, the product hexane solution of the reaction after centrifugation were placed in quartz cuvette and irradiated for the desired amount of time with LED light sources or by using UV lamp. The samples were irradiated for 30 min by 660 nm, 445 nm and 330 nm 100 mW LED light sources and 255 5 mW UV lamp. Then, TEM grids were casted under the dark from the irradiated solution for TEM characterization. The dark synthesis product solution and the irradiated product solution had been measured in UV-vis absorption and PL for optical characterization.

Figure 1B:
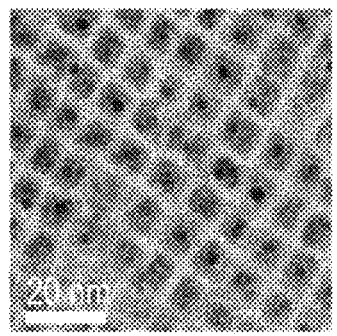
Figure 1C:
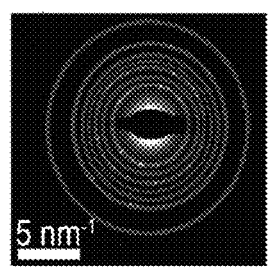
Figure 1D:
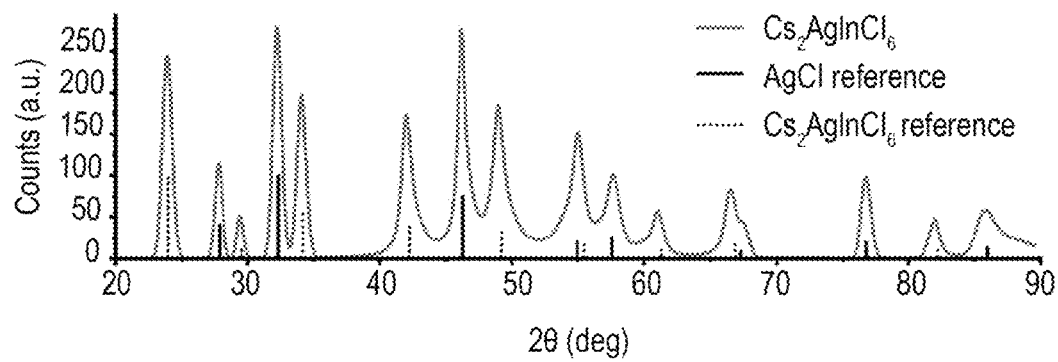
Figure 2A:
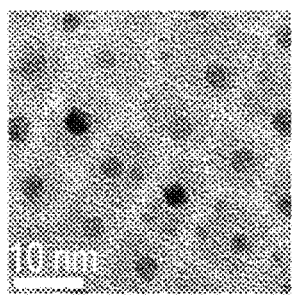
FIGS. 2A-2F show high-resolution TEM of $Cs_2AgInCl_6$ NCs (2A); HAADF-STEM image of $Cs_2AgInCl_6$ NCs with spherical NP decorations and large spherical NP byproduct (2B); and EDX elemental mapping of (2B) image for silver, chlorine, cesium and indium respectively. The identity of both the decorations and byproduct NP is assigned to metallic silver (2C-2F).
Figure 2B:
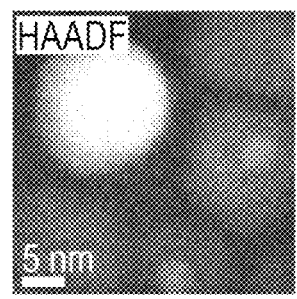
Figure 2C:
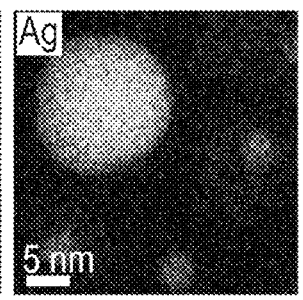
Figure 2D:
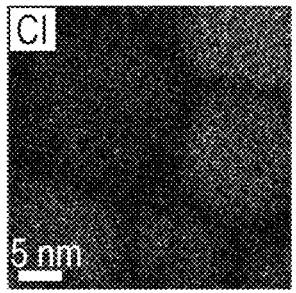
Figure 2E:
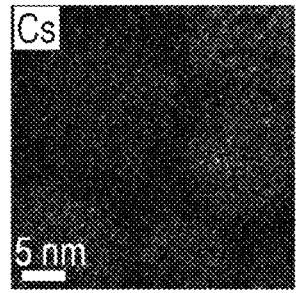
Figure 2F:
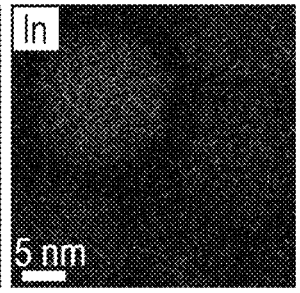

Results and Discussion $Cs_2AgInCl_6$ colloidal nanocrystals characterization. The synthesis of $Cs_2AgInCl_6$ NCs was performed using a colloidal hot-injection approach in which metal acetate (ac) precursors (i.e., Ag(ac), In(ac)$_3$, and Cs(ac)) are first dissolved in o-xylene together with organic ligand surfactants (oleylamine (OLAM) and oleic acid (OLAC)). The precursors solution is heated for the desired complexation time until benzoyl chloride is swiftly injected to induce nucleation and growth of $Cs_2AgInCl_6$ NCs. After a desired reaction time the reaction solution is quenched in an ice-water bath, cleaned and redispersed in hexene (see Experimental Section for details). TEM characterization of the synthesis end product shows 5-10 nm rectangular-shaped NCs of $Cs_2AgInCl_6$ (FIG. 1B). As seen in the TEM images, the cubic shaped $Cs_2AgInCl_6$ NCs are decorated by high contrast spherical NPs. To verify the crystal structure, XRD study of the end products was conducted and confirmed the presence of double perovskite $Cs_2AgInCl_6$ phase (ICDD number 01-085-7533) as well as a silver chloride byproduct (ICDD number 1-1013) (FIG. 1D). Selected area electron diffraction (SAED) seen in FIG. 1C resulted in a polycrystalline ring pattern indicating two phases. These phases were determined to be representative of $Cs_2AgInCl_6$ in addition to either metallic silver or AgCl. To further probe the identity of the higher contrast spherical decorations, we conducted high-resolution (HR) Energy Dispersive X-ray Spectroscopy (EDX) elemental mapping (FIGS. 2C-2F). The EDX elemental mapping and fitting for the cuboid shaped nanocrystals resulted in composition of 21.08±2.87% Cs, 9.21±1.35% Ag, 9.68±1.41% In. and 60.03±5.00% Cl. This result is in strong agreement with previous reports for $Cs_2AgInCl_6$ (Dahl et al., 2019; Locardi et al., 2018). High-resolution elemental mapping for several of the high-contrast morphologically distinct spherical NPs showed higher Ag composition as high as 92.52±20.16% Ag, indicating the spherical NPs are indeed metallic silver. This agrees with low resolution EDX mapping by Dahl et al. (2019) for the $Cs_2AgInCl_6$ system and Bekenstein et al. (2018) for the $Cs_2AgBiBr_6$ system.

Two types of silver NP decorations. In order to determine the origin and role of the spherical metallic silver NPs in the $Cs_2AgInCl_6$ NCs colloidal system, we surveyed several HR-TEM images of the $Cs_2AgInCl_6$ NCs with decorations from different synthetic batches. In most of the $Cs_2AgInCl_6$ NCs, multiple Ag NPs decorations can be found on the same rectangular $Cs_2AgInCl_6$ NC (FIGS. 3A-3B). Upon closer inspection, two different populations of Ag NPs can be differentiated, with distinct size difference. A large centralized NP (primary population) along with smaller surrounding silver decorations (secondary population). The primary NP is typically located near the center of the cuboid in the TEM projected image (not necessarily a core-shell structure). The smaller decorations tend to mainly be located at the edges and corners of the $Cs_2AgInCl_6$ NCs. There is a clear correlation between the position of the silver decoration relative to the NC edge and the decoration's diameter, as seen in FIG. 3C, suggesting two distinct modes of growth for these different Ag NP. Closer examination of the silver decorations at the edges and corners of the particle (secondary population), reveal cases where the NPs were partially located outside of the $Cs_2AgInCl_6$ NCs projection. This indicates silver NPs secondary population may reside on surfaces of the $Cs_2AgInCl_6$ NC and not necessarily embedded inside them. We recall that corners and edges of the $Cs_2AgInCl_6$ NC have low effective concentrations of surfactant ligands, making them more favorable for Ag NPs adsorption. Similarly, low ligand density was associated with selective deposition of Au NPs in CdSe@CdS tetrapods, nanorods and $CsPbBr_3$, secondary silver NPs are being adsorbed or reduced onto the edges and surfaces post growth of the perovskite crystal, or are the result of degradation. Now, we discuss the large centralized decoration (primary population). In order to determine if the NPs are embedded in a core-shell structure or on the surfaces of the crystals, we conducted an aberration corrected high-resolution TEM tilting experiment. By changing the angle of the TEM grid we discovered that the central large Ag decorations are located on the surface of the $Cs_2AgInCl_6$ NCs as well (data not shown). This is evident by the large central decoration located partially outside the projected edge of the $Cs_2AgInCl_6$ NCs when the tilting angle increases (data not shown).

Figure 4A:
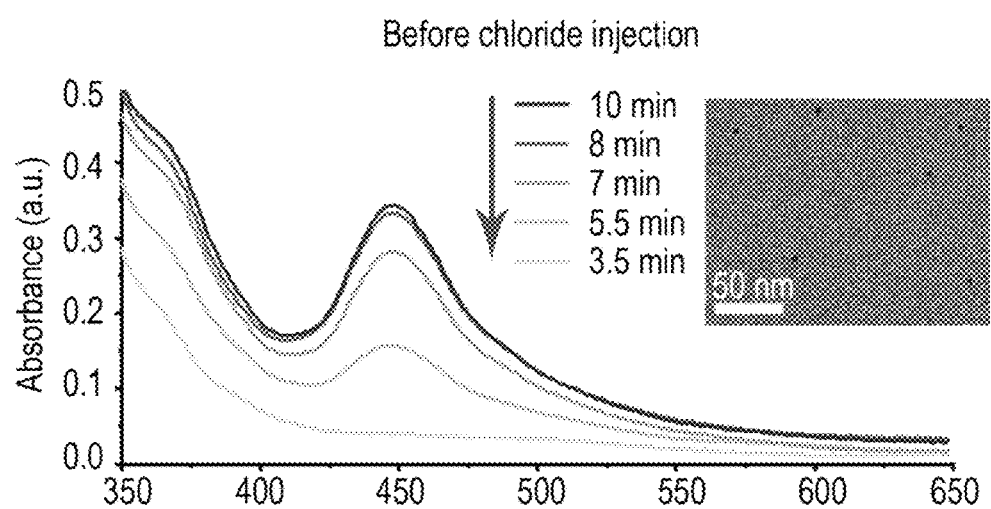
FIGS. 4A-4D show (4A) absorbance spectrum of 45° C. reaction mixture at different times and complexation stage. Formation of metallic silver NPs is indicated by the increase in localized surface plasmon resonance (LSPR) peak. Inset: Low resolution TEM image of metallic silver NPs formed during complexation time. (4B) Images of the reaction solution at different complexation times at 45° C., 0 min, 3.5 min, 5.5 min, 8 min and 10 min (from left to right). (4C) Absorbance spectrum of diluted reaction mixture at different reaction times at 25° C. after ice bath quenching. LSPR peak is shifted from 450 nm (as seen in A) to 520 nm and overall scattering increases. Inset: Low resolution TEM image of metallic silver NPs decorating $Cs_2AgInCl_6$ NCs after injection of chloride and reaction. (4D) Images of the reaction solution at different reaction times at 45° C., 0 sec, 2 sec, 4 sec, 7 sec and 10 sec (from left to right).
Figure 4B:
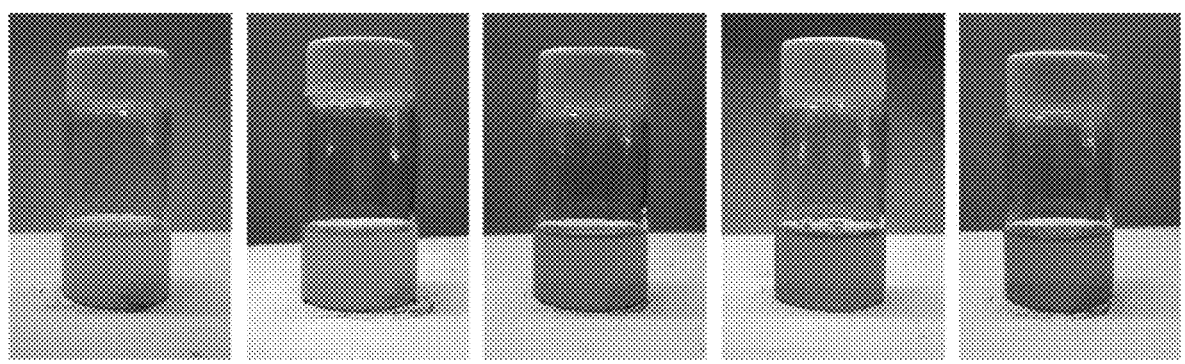

Silver NPs seed mediated nucleation of $Cs_2AgInCl_6$ nanocrystals. In order to understand the stage in the reaction in which the silver NPs form and their role in the perovskite crystal growth, we have conducted a series of synthetic experiments. We observed that the overall complexation time has a major effect on the color of the precursor's solution. FIGS. 4A-4B present the color change of the solution from clear to yellow-orange with increased intensity at longer complexation time. We assign this color change to a silver surface plasmon resonance. Fundamentally, the plasmon appearance indicates formation of metallic silver NPs due to reduction of Ag-acetate by oleylamine during the complexation stage which is prior to chloride injection and perovskite formation. The formation of metallic silver NPs from Ag ions at the presence of both aliphatic ligand (oleic acid) and reducing agent (oleylamine) is well known in the scientific literature and is used as one of the main synthetic methods for synthesizing metallic silver colloids (Muhammed el al., 2012). The presence of Ag NPs in the complexation stage was also confirmed by TEM imaging (FIG. 4A), along with XRD analysis (data not shown). XPS analysis on the end product of the reaction identified metallic silver prior to any electron beam exposure (data not shown).

Figure 4C:
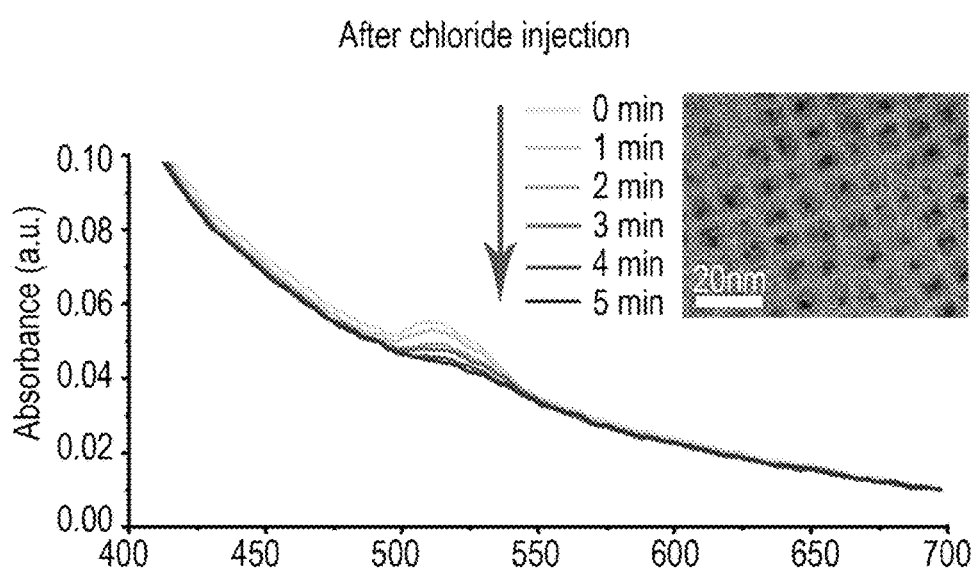
Figure 4D:
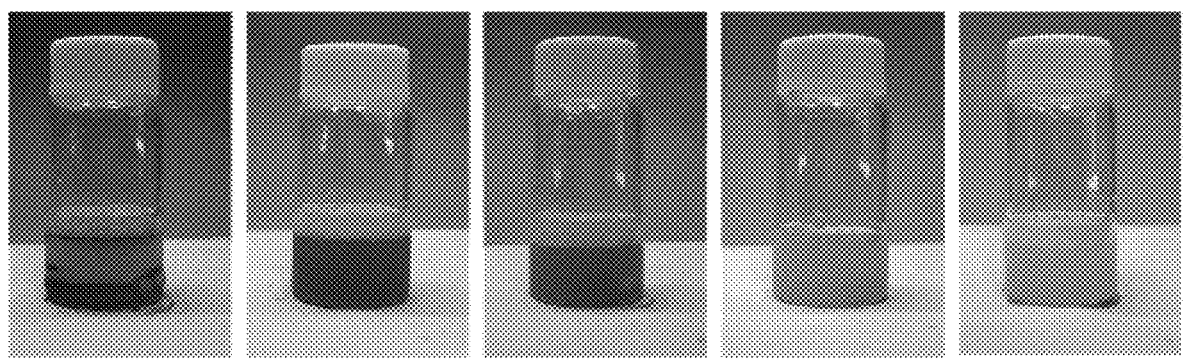

Next, we examined the chloride injection stage of the reaction. In a typical reaction at 100° C., the yellow-orange color of the solution changes rapidly as a result of the chloride injection to clear and then murky white in a matter of only a few seconds. This rapid reaction is limiting characterization approaches. In order to learn more about the chemical and physical changes during the injection, a series of reactions were conducted at a lower temperature (45° C.), thus slowing the kinetics of the reaction significantly. Images and absorbance spectrum of these experiments are shown in FIGS. 4C-4D. After the chloride injection, the plasmon peak shifts from 450 nm to 520 nm (generally associated with an increase in Ag NP size, or a change in dielectric environment). Surprisingly, size distribution analysis of the Ag NPs in TEM imaging demonstrates a decrease in the average size of the Ag NPs after the injection of chloride, from 3.5±0.6 nm to 2.2±0.4 nm (data not shown). While the smaller NP size suggests the partial consumption of Ag NPs occurring during the formation of the $Cs_2AgInCl_6$ NCs and AgCl byproduct. Smaller Ag NPs should also result in a blue shift and not the observed red shift of the plasmon (FIGS. 4A-4C). Indeed, the shifted peak of the plasmon could not be explained based on size difference of the silver NPs. We hypothesize that the plasmon red shift is a result of growth of DP NCs on the preexisting silver seeds. To further understand the shift in Ag NP plasmon resonance, a fundamental discussion of the physical origin of the light absorption by the metallic silver NPs as a plasmon is warranted. When incident photon frequency is resonant with the collective oscillation of the conduction band electrons in the Ag NP, a characteristic absorbance peak is observed, and it is known as localized surface plasmon resonance (LSPR). The resonance frequency of this LSPR is strongly dependent on the composition, size, and shape of the NPs but is also depended on the dielectric properties of the surrounding medium (Muhammed et al., 2012; Willets and Van Duyne, 2007; Taleb et al., 1998). The correlation between the maxima of the LSPR with the dielectric constant (or refractive index) of surrounding medium can be treated within the framework of the Drude model (Yang et al., 2015). Surface plasmon peak wavelength (k), is related to the refractive index of the surrounding medium (n) by the following expression:

$$\lambda^2 = \lambda_p^2(\epsilon^\infty + 2\epsilon_m) \tag{1}$$

where $\lambda_p$ is the bulk metal plasmon wavelength, $\epsilon^\infty$ is the high-frequency dielectric constant, and ($\epsilon_m = n^2$) is the optical dielectric function of the medium. Substituting equation 1 with the LSPR peak wavelength of 450 nm (FIG. 4A), metallic silver's bulk plasmon wavelength (138 nm (Yang el al., 2015)) and the optical dielectric function of o-xylene to 2.28 results in the high-frequency dielectric constant of 6.07. This result is aligned with the reported value in the literature (Yang et al., 2015). In order to explain the red shifted LSPR peak at the addition of the chloride source (FIG. 4D) we calculated the expected shift of the LSPR peak due to a change in the dielectric function of the medium as a result in growth of $Cs_2AgInCl_6$ NCs. This is done by substituting equation 1 with the same value for the bulk metal plasmon wavelength, using the high-frequency dielectric constant found before, and approximating the optical dielectric function of $Cs_2AgInCl_6$ to be ($\epsilon_m \sim 4$), based on reported dielectric function for $Cs_2BiCuCl_6$, $Cs_2AgBiCl_6$ and $Cs_2AgInCl_6$ (Soni et al., 2020) near 450 nm. This substitution results LSPR peak at 517.6 nm. This value is in strong agreement with the observed LSPR in FIG. 4D at 520 nm after the initiation of perovskite NC growth. This strongly supports heterogenous nucleation of $Cs_2AgInCl_6$ NCs at the surface of the preexisting metallic silver NPs post chloride injection.

By the previously presented hypothesis, we could now find an explanation for the different populations of Ag° NPs present in the end product of the reaction by using classical nucleation theory (CNT). In the comparison between homogeneous and heterogeneous nucleation processes of $Cs_2AgInCl_6$ NCs, many parameters are required. Such parameters include the volume and free surface area of the $Cs_2AgInCl_6$ NC, $Cs_2AgInCl_6$ surface energy and the silver NP defect surface energy. However, the favorability of heterogenous nucleation over homogenous nucleation is clear due to the reduction in the defect energy (Ag NP surface energy) in the heterogenous process. Therefore, the favorability for heterogenous nucleation is proportional to the size of the Ag NP (Karthika et al., 2016; Vehkamtaki, 2006). In such a case, it is feasible to expect that the large (primary) Ag NP on the $Cs_2AgInCl_6$ NC is the nucleation seed for DP nucleation, while the small silver NP decorations (secondary) are likely the result of post synthesis attachment or degradation process. This population of small NPs remain free from perovskite growth since heterogenous nucleation favors larger Ag NPs. The small free Ag NPs are attached mainly on the edges and corner of the $Cs_2AgInCl_6$ NC due to the lower effective ligand concentrations at these locations as described earlier. Another mysterious observation that can be explained via heterogenous nucleation is the unlikely location of the large (primary) silver NPs on the face of the DP NCs where ligand concentration is high. While the much smaller Ag NPs (secondary) are adsorbed almost exclusively on less ligand-passivated locations (corners and edges). This can be explained since growth of DP favorable on larger silver NPs that serve as seeds for nucleation, thus preexisting the facet and its passivating ligands. The smaller NPs (secondary) that remain unreacted in solution, may adsorb to less passivated areas, such as corners and edges. This therefore explains the mysterious size-location correlation of the silver NPs reported in FIG. 3A.

Figure 5A:
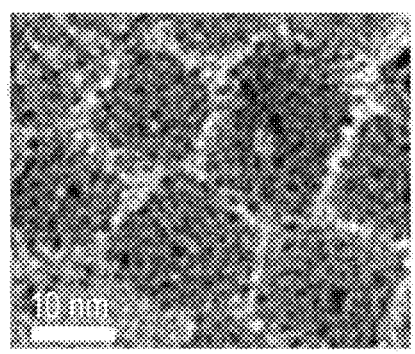
FIGS. 5A-5D show (5A) high-resolution TEM micrograph of $Cs_2AgInCl_6$ NCs, made under dark reaction conditions. The NCs have multiple small silver NPs decorations per nano-cube in different locations. (5B) High-resolution TEM micrograph of $Cs_2AgInCl_6$ NCs from sample in 5A after UV irradiation treatment (254 nm, 5 mw, 30 min). After the irradiation there is mostly one large central silver decoration per nano-cube as a result of Ostwald ripening. (5C) Optical absorbance measurements of $Cs_2AgInCl_6$ NCs before and after UV irradiation treatment. The absorbance spectrum after the irradiation has LSPR with peak at 450 nm forming. (5D) PL spectrum of $Cs_2AgInCl_6$ NCs before and after UV irradiation. PL intensity decreases after the irradiation. Inset: $Cs_2AgInCl_6$ NCs solution's visible fluorescent orange emission during the start of 254 nm irradiation experiment.
Figure 5B:
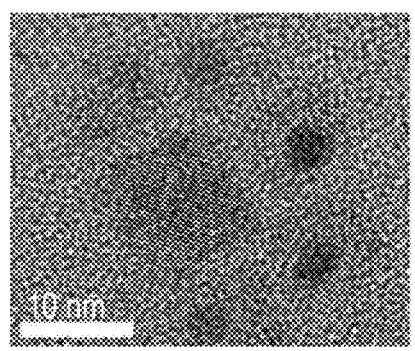

Photochemical activated Ostwald ripening of Ag NPs. Lastly, we went to test the influence of UV-Vis light irradiation on the silver decorated double perovskites, which exhibit similar structural characteristics to other metal-semiconductor hybrid colloidal hetro-systems. In order to study the effect of radiation on the metallic silver decorations, we synthesized $Cs_2AgInCl_6$ NCs under dark conditions and kept the solution this way until TEM characterization. Part of the product solution were placed in quartz cuvette and irradiated for 30 minutes with LED light sources or by using TLC-UV lamp (660 nm, 445 nm and 330 nm 100 mW LED light sources and 255 5 mW TLC-UV lamp). The sample that wasn't exposed to irradiation (FIG. 5A), demonstrated smaller than usual silver decorations and with large amount of silver decorations. Samples that were exposed to below band-gap irradiation (660 nm, 445 nm and 330 nm), didn't reveal any differences in their silver decorations population. The sample excited with above band-gap irradiation (254 nm) was the only one in which $Cs_2AgInCl_6$ NCs where excited and demonstrated clear visible orange fluorescent emission during the irradiation (FIG. 5D). TEM characterization of this sample as seen in FIG. 5B, demonstrated some perovskite NCs with only one large central silver NP decoration in contrast to the other samples in this experiment.

We assign this result to a photochemical activated electrochemical Ostwald ripening of Ag NPs induced by charge separation of the exciton across the metal-semiconductor junction at the $Cs_2AgInCl_6$—$Ag°$ interface. In this process, the smaller and less thermodynamically stable secondary Ag NPs are electrochemically oxidized to free $Ag^+$ ions that are released into the solution and are subsequently reduced by electrons localized in the larger primary Ag NP, resulting in metallic silver deposition onto an existing silver decoration. This mechanism allows for the optically activated coarsening of the central silver decoration to a more thermodynamic favorable product. Some of the small silver NPs are consumed in this coarsening process and the remaining NPs are larger, as seen in the comparison between FIG. 5A and FIG. 5B.

Figure 5C:
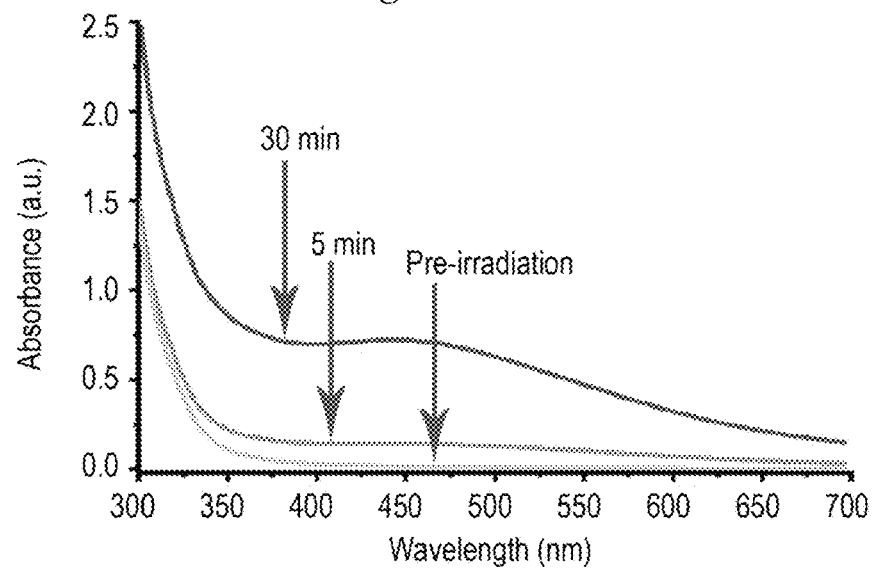
Figure 5D:
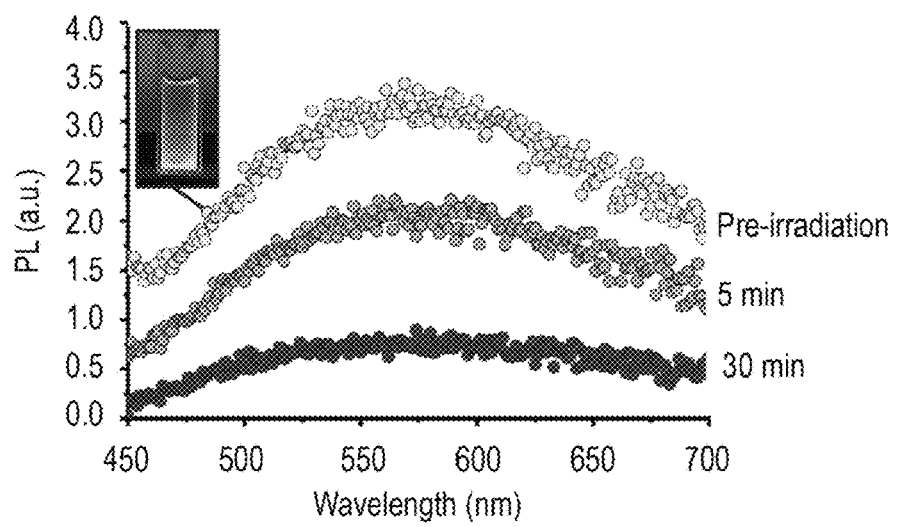

An additional difference between the excited sample and the other non-excited samples is the difference in the final color of the solution and the integral intensity of the emission, as seen in FIG. 5C. The color change of the $Cs_2AgInCl_6$ NCs solution in hexane from clear to red-orange is presented as a peak in the absorbance spectrum in FIG. 5C. This absorbance peak could be associated with LSPR due to the resulting photochemical activated Ostwald ripening of Ag NPs in the 254 nm irradiation. Another optical difference is the damping of fluorescent emission of the $Cs_2AgInCl_6$ solution as a result of the duration of the 254 nm irradiation. This observation can also be explained by the Ag NPs coarsening. $Cs_2AgInCl_6$ NC with a large central silver decoration is more likely to undergo non radiative recombination and therefore lower intensity of the emission of the irradiated sample, as presented in FIG. 5D. Therefore, the mechanism of photochemical activated Ostwald ripening of Ag NPs could be a major part of the degradation in optical emission properties in the $Cs_2AgInCl_6$ and could have a negative effect in many applications for the $Cs_2AgInCl_6$ NCs, such as display applications.

Conclusions

In this Study, we show empirical evidence of the role metallic silver NPs play as heterogenous nucleation seeds for $Cs_2AgInCl_6$ NCs. Formation of silver NPs occurs through reduction of the $Ag^+$ by amines in the complexation stage of the NCs synthesis. Subsequent injection of chloride results in $Cs_2AgInCl_6$ NCs heterogenous nucleation on the preexisting silver NPs. Moreover, we demonstrate optical induced Ostwald ripening of Ag NPs during $Cs_2AgInCl_6$ excitation. The ripening is accompanied with changes to the optical properties of the suspension, plasmonic absorption and quenched emission. Understanding the role of the metallic silver in this system open possibilities for the controlled design of lead-free perovskite-metal hybrid nanocrystals.

Study 2. Synthesis and Characterization of Two-Dimensional $Cs_2AgInCl_6$ Nanoplates Experimental Chemicals. Cesium carbonate ($Cs_2CO_3$. 99.9%), silver nitrate ($AgNO_3$, 99.9%), indium chloride ($InCl_3$, 99.999%), 1-octadecene (ODE, technical grade 90%), oleylamine (OAm, ≥98%), oleic acid (≥99% (GC)), hydrochloric acid (HCl, 37%), were purchased from Sigma-Aldrich. All the chemicals were used directly without further purification.

Cs-oleate stock solution preparation. 825 mg $Cs_2CO_3$ and 10 mL oleic acid were loaded in a 25-mL three-neck flask. The mixture was first degassed under vacuum at 100° C. for 30 min, and then heated up to 150° C. under $N_2$ flow for 1 hour. The reaction solution was then cooled to room temperature for further use.

Synthesis of $Cs_2AgInCl_6$ double perovskite nanoplatelets (NPLs). In a typical reaction for the synthesis of $Cs_2AgInCl_6$ NPLs, 0.1 mmol $InCl_3$, 0.2 mmol $AgNO_3$, 4 mL ODE, 70 μL HCl, 1 mL oleic acid and 1 mL OAm were loaded into a 20 ml glass vial with a magnetic stirring bar. The solution firstly heated to 60° C. for 30 min, and then the reaction solution was heated up to 100° C. for 20 min, to dissolve the precursors. Subsequently, the vial cooled to room temperature while stirring. When the solution temperature reached room temperature, 0.3 mL of the Cs-oleate solution was injected into the reaction solution, and the vial was kept at room temperature for an additional 30 min.

A centrifugation process was used to separate the sample from the reaction solution. For measurements, the NPLs reaction mixture was precipitated by centrifugation at 12,000 rpm for 5 min. After this, the precipitate was dispersed in hexane and centrifuged again for 5 min at 8000 rpm. Finally, the $Cs_2AgInCl_6$ NPLs were collected by decanting the suspension and store in hexane.

Results

Figure 6A:
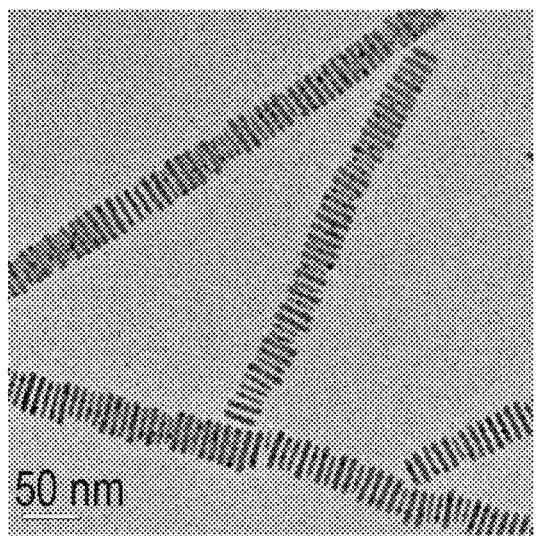
FIGS. 6A-6B show a TEM micrograph of stacked $Cs_2AgInCl_6$ double perovskite NPLs with lateral dimension of 30.5±3.8 nm and thickness of 5.4±0.9 nm (6A); and a HR-TEM micrograph depicting atomic resolution of $Cs_2AgInCl_6$ double perovskite NPLs (6B).
Figure 6B:
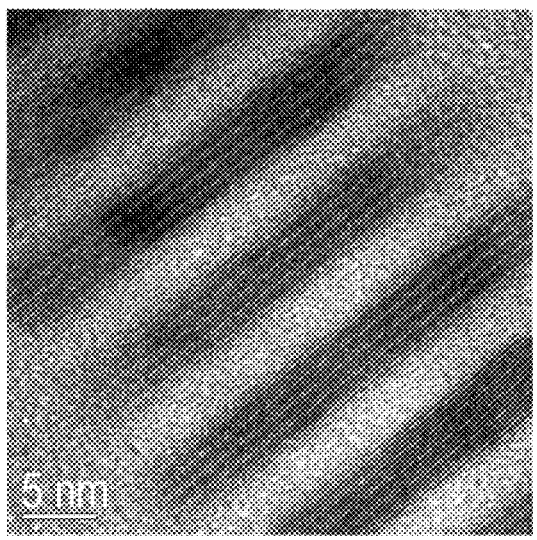

FIG. 6A shows a TEM micrograph of stacked $Cs_2AgInCl_6$ double perovskite NPLs with lateral dimension of 30.5±3.8 nm and thickness of 5.4±0.9 nm; and FIG. 6B shows a high-resolution (HR)-TEM micrograph depicting atomic resolution of $Cs_2AgInCl_6$ double perovskite NPLs.

Figure 7A:
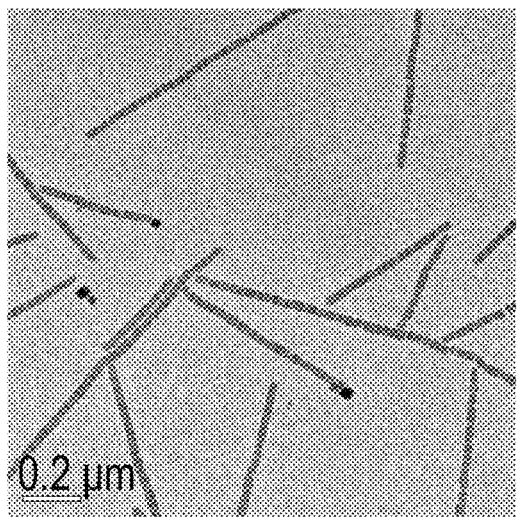
FIGS. 7A-7B show a TEM micrograph of both flat lying and stacked $Cs_2AgInCl_6$ double perovskite NPLs (7A); and a HR-TEM micrograph depicting atomic resolution of both flat lying and stacked $Cs_2AgInCl_6$ double perovskite NPLs (7B).
Figure 7B:
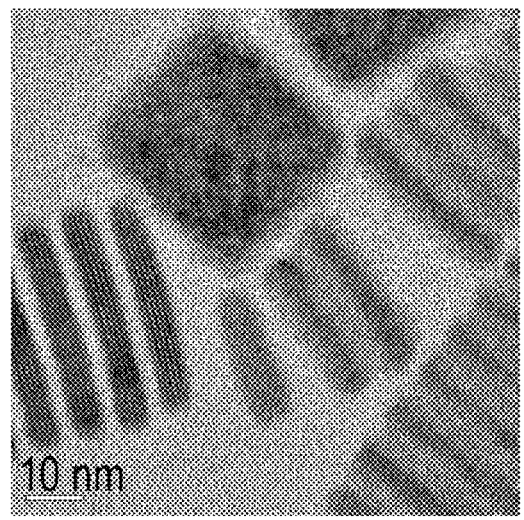

FIG. 7A shows a TEM micrograph of both flat lying and stacked $Cs_2AgInCl_6$ double perovskite NPLs; and FIG. 7B shows HR-TEM micrograph depicting atomic resolution of both flat lying and stacked $Cs_2AgInCl_6$ double perovskite NPLs.

Study 3. Synthesis and Characterization of 2D $Cs_2AgBiBr_6$ Nanoplates

Figure 8:
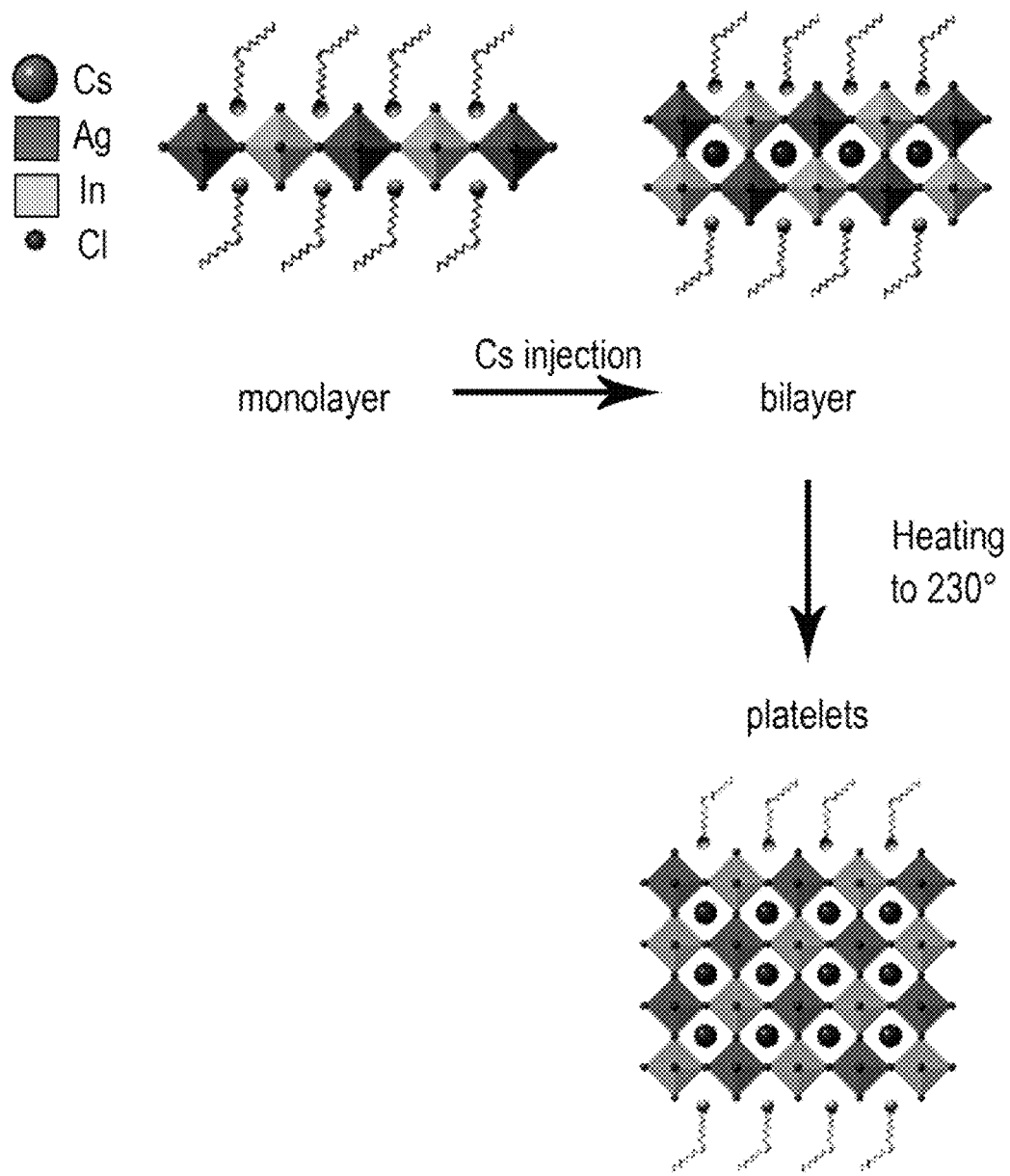
FIG. 8 schematically depicts a monolayer of the formula $L_4ABXS$ (upper left, without cesium), which is used as a building block for the preparation of a 2D double perovskite nanomaterial as disclosed herein. Upon addition of Cs, a bilayer or a thicker structure is formed, which upon heating of the sample is crystallized to yield nanoplates.
Figure 9A:
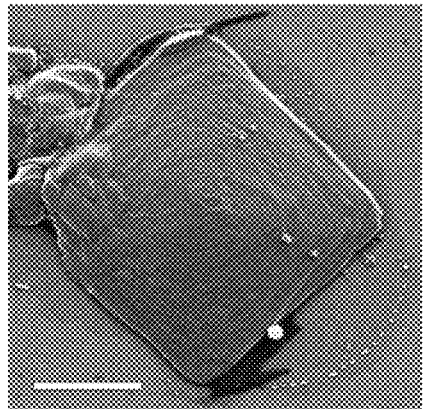
FIGS. 9A-9D show SEM images of monolayers (9A) and nanoplatelets of $Cs_2AgBiBr_6$ (9B) and their corresponding XRD patterns (9C and 9D, respectively), showing both periodic reflections from nanoplatelet stacks and peaks matching to the perovskite unit cell. The scale bar for 9A and 9B is 5 and 1 micron, respectively.
Figure 9B:
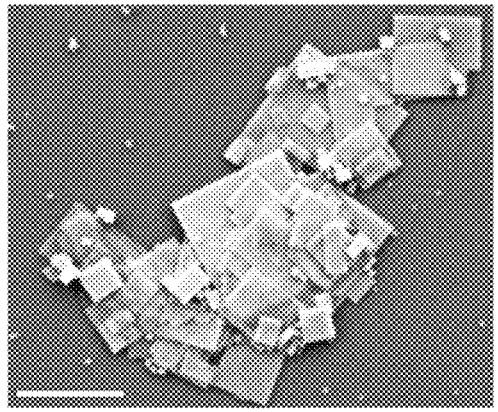
Figure 9C:
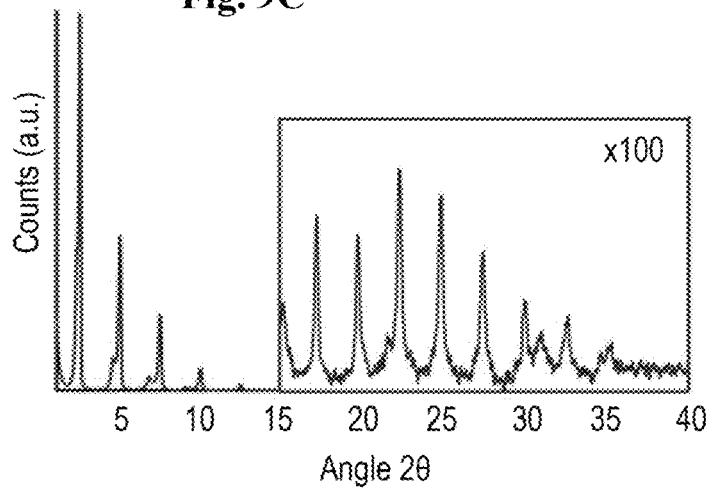
Figure 9D:
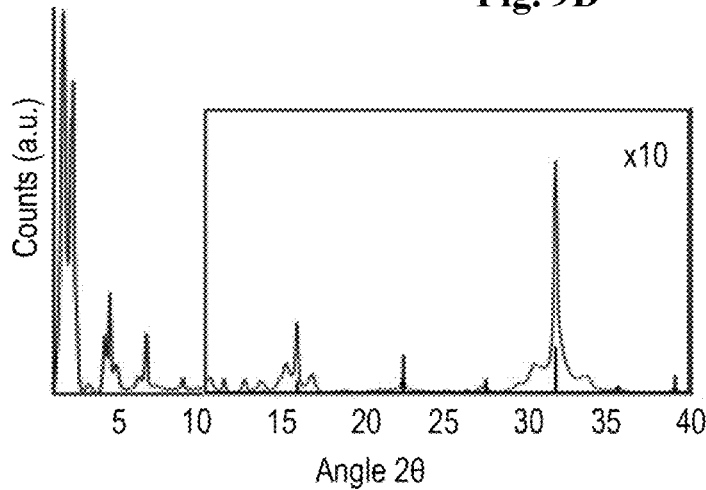
Figure 10A:
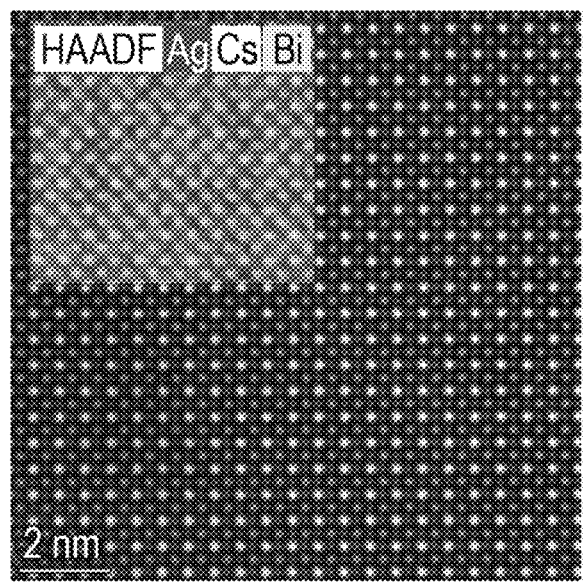
FIGS. 10A-10E show (10A) high resolution HAADF-STEM image of $Cs_2AgBiBr_6$ nanoplatelet. Inset-atomic resolution EDS elemental map of Ag, Cs and Bi atoms not shown for clarity. (10B) Single crystal diffraction with zone axis taken from (10C) TEM image of nanoplatelet. (10D) Lower resolution HAADF-STEM image of the platelets. (10E) AFM image of the nanoplatelets showcasing a thickness of a few nanometers.
Figure 10B:
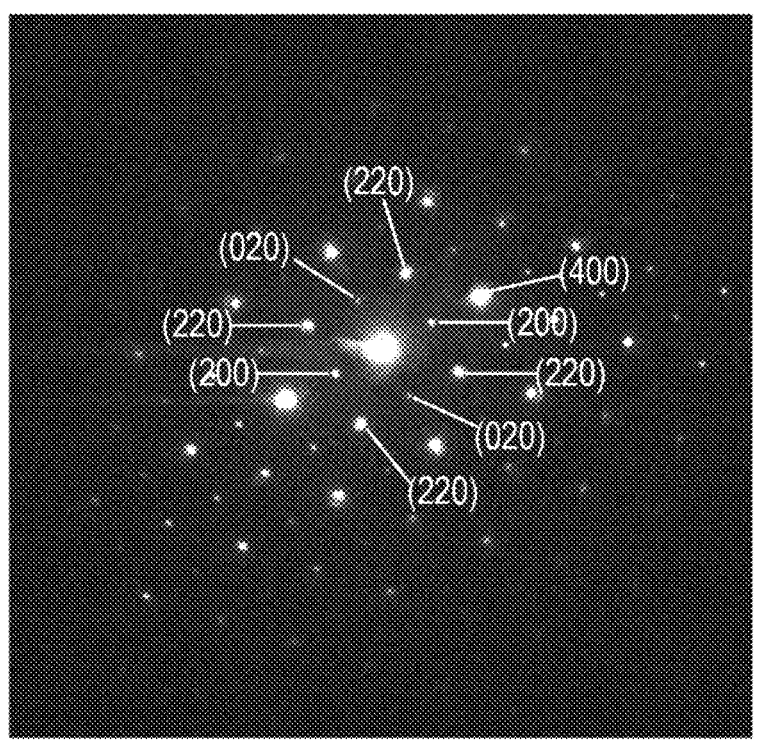
Figure 10C:
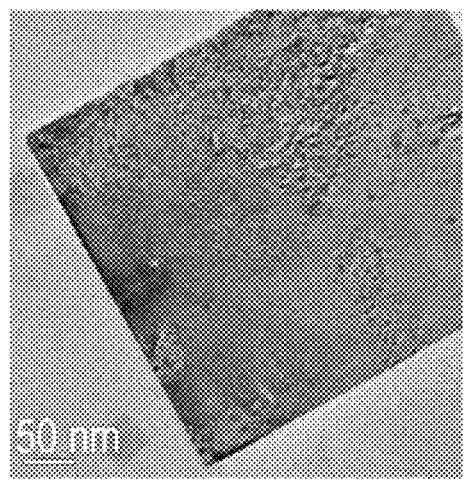
Figure 10D:
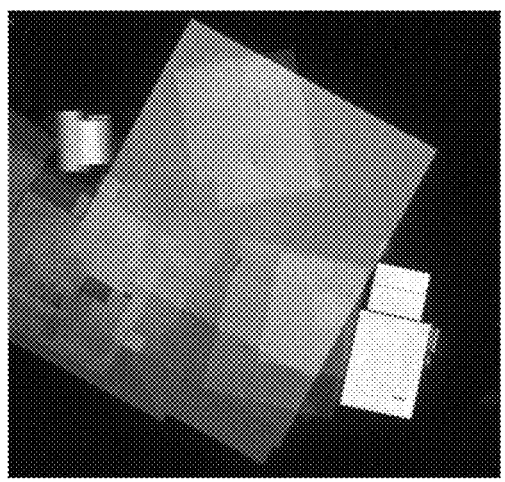
Figure 10E:
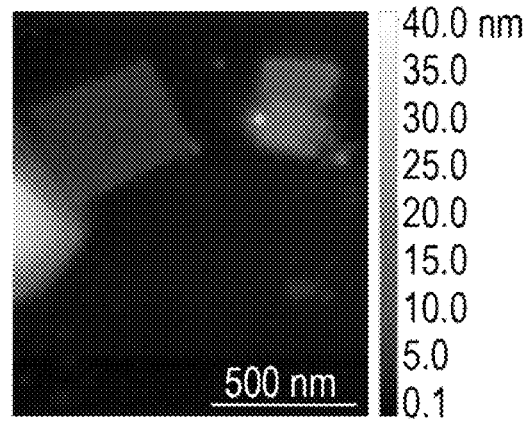

The present Example demonstrates an approach different than that described in Example 1, for preparing 2D $Cs_2AgInCl_6$ nanoplates in a controlled way. In particular, we demonstrate the formation of highly ordered lead-free structures of stacked nanoplates (NPLs) using the self-assembly of double-perovskite monolayers and a later addition of the cesium component. The single monolayer, $L_4ABX_8$, where L is the alkylamine ligand determines the interlayer distances between the nanoplates. The tendency of these materials to arrange in a well-ordered stacking pattern is observed clearly by different characterization methods, and the interlayer spacing between the monolayers is accurately calculated from XRD diffractograms (FIG. 8). We can then use the monolayers as building blocks for thicker (2-4 monolayers thick) NPLs by replacing the organic ligands with stoichiometric Cs cations, to form highly crystalline $Cs_2AgBiBr_6$ NPLs confirmed via TEM/SEM and AFM characterization. (FIG. 9).

REFERENCES

Akkerman, Q. A. et al., Tuning the optical properties of cesium lead halide perovskite nanocrystals by anion exchange reactions. *J. Am. Chem. Soc.*, 2015, 137(32), 10276

Akkerman, Q. A. et al., Genesis, challenges and opportunities for colloidal lead halide perovskite nanocrystals. *Nat. Mater.*, 2018, 17, 394

Babayigit, A. et al., Assessing the toxicity of Pb- and Sn-based perovskite solar cells in model organism *Danio rerio*. *Sci. Rep.*, 2016, 6, 18721

Bekenstein, Y. et al. The making and breaking of lead-free double perovskite nanocrystals of cesium silver-bismuth halide compositions. *Nano Lett.*, 2018, 18(6), 3502

Chen, N. et al., Yb—and Mn-doped lead-free double perovskite $Cs_2AgBiX_6$ (x=$Cl^-$, $Br^-$) nanocrystals. *ACS Appl. Mater. Interfaces*, 2019, 11(18), 16855

Connor, B. A. et al., Dimensional reduction of the small-bandgap double perovskite $Cs_2AgTlBr_6$. *Chem. Sci.*, 2020, 11, 7708

Creutz, S. et al., Colloidal nanocrystals of lead-free double-perovskite (elpasolite) semiconductors: synthesis and anion exchange to access new materials. *Nano Lett.*, 2018, 18(2), 1118

Dahl, J. C. et al., Probing the stability and band gaps of $Cs_2AgInCl_6$ and $Cs_2AgSbCl_6$ lead-free double perovskite nanocrystals. *Chem. Mater.*, 2019, 31(9), 3134

Dang, Z. et al., In situ transmission electron microscopy study of electron beam-induced transformations in colloidal cesium lead halide perovskite nanocrystals. *ACS Nano*, 2017, 11(2), 2124

Giustino, F. and Snaith, H. J., Toward lead-free perovskite solar cells. *ACS Energy Letters*, 2016, 1(6), 1233

Hailegnaw, B. et al., Rain on methylammonium lead iodide based perovskites: Possible environmental effects of perovskite solar cells. *J. Phys. Chem. Lett.*, 2015, 6(9), 1543

Karthika, S. et al., A Review of classical and nonclassical nucleation theories. *Cryst. Growth Des.*, 2016, 16(11), 6663

Khalfin, S. and Bekenstein, Y., Advances in lead-free double perovskite nanocrystals, engineering band-gaps and enhancing stability through composition tunability. *Nanoscale*, 2019, 11(18), 8665

Kovalenko, M. V. et al., Properties and potential optoelectronic applications of lead halide perovskite nanocrystals. *Science*, 2017, 358(6364), 745

Liu, Y. et al., Design optimization of lead-free perovskite $Cs_2AgInCl_6$:Bi nanocrystals with 11.4% photoluminescence quantum yield. *Chem. Mater.*, 2019, 31, 3333

Locardi, F. et al., Colloidal synthesis of double perovskite $Cs_2AgInCl_6$ and Mn-doped $Cs_2AgInCl_6$ nanocrystals. *J. Am. Chem. Soc.*, 2018, 140(40), 12989

Locardi, F. et al., Emissive bi-doped double perovskite $Cs_2Ag_{1-x}Na_xInCl_6$ nanocrystals. *ACS Energy Lett.*, 2019, 4(8), 1976

Luo, J. et al., Efficient and stable emission of warm-white light from lead-free halide double perovskites. *Nature*, 2018, 563, 541

Muhammed, M. A. H. et al., Growth of in situ functionalized luminescent silver nanoclusters by direct reduction and size focusing. *ACS Nano*, 2012, 6(10), 8950

Shamsi, J. et al., Colloidal synthesis of quantum confined single crystal $CsPbBr_3$ nanosheets with lateral size control up to the micrometer range. *J. Am. Chem. Soc.*, 2016, 138(23), 7240

Slavney, A. H. et al., Bismuth-halide double perovskite with long carrier recombination lifetime for photovoltaic applications. *J. Am. Chem. Soc.*, 2016, 138(7), 2138

Soni, A. et al., Investigating effect of strain on electronic and optical properties of lead free double perovskite $Cs_2AgInCl_6$ solar cell compound: A first principle calculation. *J. Alloys Compd*, 2020, 817, 152758

Swamkar, A. et al., Beyond colloidal cesium lead halide perovskite nanocrystals: analogous metal halides and doping. *ACS Energy Lett.*, 2017, 2(5), 1089

Taleb, A. et al., Optical properties of self-assembled 2D and 3D superlattices of silver nanoparticles. *J. Phys. Chem. B*, 1998, 102(12), 2214

Udayabhaskararao, T. et al., Nucleation, growth, and structural transformations of perovskite nanocrystals. *Chem. Mater*, 2017, 29(3), 1302

Vehkamäki, H., Classical nucleation theory in multicomponent systems, Published by: Springer Berlin Heidelberg, 2006. ISBN:9783540312185

Volonakis, G. et al. Lead-free halide double perovskites via heterovalent substitution of noble metals. *J. Phys. Chem. Lett.*, 2016, 7(7), 1254

Willets, K. A. and Van Duyne, R. P., Localized surface plasmon resonance spectroscopy and sensing. *Annu. Rev. Phys. Chem.*, 2007, 58, 267

Yang, H. U. et al., Optical dielectric function of silver. *Phys. Rev. B*, 2015, 91,

What is claimed is:

1. A process for the preparation of a double perovskite nanomaterial represented by the formula $Cs_2ABX_6$ or $L_4[Cs_2ABX_6]_{n-1}ABX_8$, wherein:

A is a metal ion selected from the group consisting of Ag(I), Au(I), and Cu(I);

B is a metal ion selected from the group consisting of In(III), Bi(III), Sb(III), Fe(III), and Tl(III);

X is a halogen;

L each independently is a ligand of the formula R—COO⁻ or R—CH₂NH₃⁺, or of the formula $(R)_3$—P or $(R)_3$—P=O, wherein R each independently is selected from the group consisting of $(C_2\text{-}C_{19})$alkyl, $(C_2\text{-}C_{19})$alkenyl, $(C_2\text{-}C_{19})$alkynyl, and $(C_6\text{-}C_{14})$aryl; and n is an integer of 2 to 20, representing the number of metal-halide octahedral layers present in the nanomaterial, wherein said nanomaterial is a two-dimensional (2D) material having a shape of a nanoplate having a diameter or lateral dimensions of about 10-50 nm, and a thickness of about 1-10 nm; or a nanosheet having a diameter or lateral dimensions of about 50-1500 nm, and a thickness of about 1-20 nm, said process comprising:

(i) mixing a salt of metal ion A, a salt of metal ion B, and either a cesium salt or a source of said halogen, in a solvent, in the presence of an acid-base couple comprising a mixture of (a) an acid of the formula R—COOH and a base of the formula R—CH₂NH₂; or (b) an acid of the formula $(R)_3$—P=O and a base of the formula $(R)_3$—P;

(ii) optionally heating the mixture obtained in (i) to a temperature of up to about 100° C.; and (iii) introducing a nucleation initiator into the reaction mixture obtained in (ii) to thereby initiate assembly of said double perovskite nanomaterial, provided that:

(a) when said cesium salt is included within the salts mixed in step (i), said nucleation initiator is a benzoyl halide of the formula $C_6H_5$—C(O)—X, and the introduction of said nucleation initiator is followed by cooling of the reaction mixture, when necessary, to room temperature, to thereby obtain said 2D double perovskite nanomaterial in said solvent; and (b) when said cesium salt is not included within the salts mixed in step (ii), said nucleation initiator is a compound of the formula Cs—R, and the introduction of said nucleation initiator is preceded by cooling of the reaction mixture, when necessary, to room temperature, to thereby obtain said 2D double perovskite nanomaterial in said solvent.

2. The process of claim 1, wherein said cesium salt, said salt of metal ion A, and said salt of metal ion B each independently is acetate, chloride, bromide, nitrate, mesylate, maleate, fumarate, tartrate, p-toluenesulfonate, benzenesulfonate, benzoate, phosphate, sulfate, citrate, carbonate, or succinate salt.

3. The process of claim 1, wherein said solvent is a non-coordinating solvent.

4. The process of claim 1, wherein said halogen source is a compound of the formula HX, $C_6H_5$—C(O)—X, alkyl-X, alkenyl-X, or alkynyl-X.

5. The process of claim 1, wherein A is Ag(I); and B is In(III).

6. The process of claim 5, wherein said cesium salt, silver salt, and indium salt each is acetate salt, and said salts are all mixed in step (i).

7. The process of claim 5, wherein said silver salt is silver nitrate, said indium salt is indium chloride, and said salts are mixed in step (i) with said halogen source.

8. The process of claim 1, wherein said acid-base couple consists of oleic acid and oleylamine.

9. The process of claim 8, wherein said cesium salt is included within the salts mixed in step (i); and the ratio between said oleic acid and oleylamine present in step (i) is about 3:1, respectively, by volume.

10. The process of claim 8, wherein said cesium salt is not included within the salts mixed in step (i); and the ratio between said oleic acid and oleylamine present in step (i) is about 1:1 by volume.

11. The process of claim 1, wherein said cesium salt is included within the salts mixed in step (i); and said cooling of the reaction mixture starts several seconds and no more than 3 minutes after step (iii), optionally using cold-water bath.

12. The process of claim 1, for the preparation of a 2D double perovskite nanomaterial represented by the formula $Cs_2AgInCl_6$ or $L_4[Cs_2ABCl_6]_{n-1}ABCl_8$, wherein L each independently is negatively charged oleic acid or positively charged oleylamine; and n is an integer of 2 to 20, representing the number of metal-chloride octahedral layers present in the nanomaterial, said process comprising:
(i) mixing cesium acetate, silver acetate, and indium(III) acetate at a molar ratio of about 1:2:2, respectively, in a solvent, in the presence of an acid-base couple comprising a mixture of oleic acid and oleylamine at a ratio of about 3:1, respectively, by volume;
(ii) heating the mixture obtained in (i) to a temperature of about 70° C.;
(iii) rapidly injecting benzoyl chloride into the reaction mixture obtained in (ii), wherein the molar ratio of the benzoyl chloride to the cesium salt mixed in step (i) is about 6:1, respectively; and
(iv) cooling the reaction mixture obtained in step (iii) to room temperature, within several seconds and not more than 3 minutes after step (iii), optionally using a cold-water or ice bath, to thereby obtain said 2D double perovskite nanomaterial in said solvent.

13. The process of claim 1, for the preparation of a 2D double perovskite nanomaterial represented by the formula $Cs_2AgInCl_6$ or $L_4[Cs_2ABCl_6]_{n-1}ABCl_8$, wherein L each independently is negatively charged oleic acid or positively charged oleylamine; and n is an integer of 2 to 10, representing the number of metal-chloride octahedral layers present in the nanomaterial, said process comprising:
(i) mixing silver nitrate and indium(III) chloride at a molar ratio of about 2:1, respectively, in a solvent, in the presence of HCl and an acid-base couple comprising a mixture of oleic acid and oleylamine at a ratio of about 1:1, by volume;
(ii) heating the mixture obtained in (i) to a temperature of about 100° C.;
iii) cooling the reaction mixture obtained in step (ii) to room temperature, optionally using a cold-water or ice bath; and
(iv) injecting cesium oleate into the reaction mixture obtained in (iii), wherein the molar ratio of the cesium oleate to the silver salt mixed in step (i) is about 1:2.5, respectively, to thereby obtain said 2D double perovskite nanomaterial in said solvent.

14. The process of claim 1, further comprising a step for precipitating the 2D double perovskite nanomaterial obtained from said solvent.

15. The process of claim 1, wherein said 2D double perovskite nanomaterial has a shape of a nanoplate.

16. A process for the preparation of a double perovskite nanomaterial represented by the formula $Cs_2ABX_6$ or $L_4[Cs_2ABX_6]_{n-1}ABX_8$, wherein:
A is a metal ion selected from the group consisting of Ag(I), Au(I), and Cu(I);
B is a metal ion selected from the group consisting of In(III), Bi(III), Sb(III), Fe(III), and Tl(III);
X is a halogen;
L each independently is a ligand of the formula R—COO$^-$ or R—CH$_2$NH$_3^+$, or of the formula (R)$_3$—P or (R)$_3$—P=O, wherein R each independently is selected from the group consisting of ($C_2$-$C_{19}$)alkyl, ($C_2$-$C_{19}$)alkenyl, ($C_2$-$C_{19}$)alkynyl, and ($C_6$-$C_{14}$)aryl; and
n is an integer of 2 to 20, representing the number of metal-halide octahedral layers present in the nanomaterial,
wherein said nanomaterial is a two-dimensional (2D) material having a shape of a nanosheet having a diameter or lateral dimensions of about 50-1500 nm, and a thickness of about 1-20 nm, said process comprising:
(i) providing a solution of a double perovskite nanomaterial represented by the formula $Cs_2ABX_6$ or $L_4[Cs_2ABX_6]_{n-1}ABX_8$ in a solvent, wherein said nanomaterial is either a three-dimensional material having a shape of nanocubes or a 2D material having a shape of nanoplates;
(ii) evaporating said solvent, in a controlled manner, to thereby allow self-assembly of a solid array of said double perovskite nanomaterial; and
(iii) recrystallizing said solid array with either chemical or physical means to thereby obtain said 2D double perovskite nanomaterial.

17. The process of claim 16, wherein said solvent each independently is a non-coordinating solvent.

18. The process of claim 16, wherein said evaporating said solvent in step (ii) comprises precipitating said solution and then removing the liquid phase to thereby obtain a solid material, and re-dissolving said solid material in a solvent to thereby remove/wash excess of ligands from said solid material.

19. The process of claim 18, wherein precipitating said solution in step (ii) is carried out by centrifugation.

20. The process of claim 18, wherein step (ii) is repeated at least twice.

21. The process of claim 16, wherein said recrystallizing said solid array with physical means in step (iii) comprises aging the solid material obtained in step (ii) at room temperature for a time period of between about 24 hours to about 7 days.

22. The process of claim 16, wherein said recrystallizing said solid array with physical means in step (iii) comprises heating the solid material obtained in step (ii) to about 180° C. for about 30 seconds under inert environment; or oxygen plasma treatment of said solid material, each time for about 3 seconds.

23. A double perovskite building block represented by the formula $L_4ABX_8$, wherein:
- A is a metal ion selected from the group consisting of Ag(I), Au(I), and Cu(I);
- B is a metal ion selected from the group consisting of In(III), Bi(III), Sb(III), Fe(III), and Tl(III);
- X is a halogen; and
- L each independently is a ligand of the formula R—COO⁻ or R—CH$_2$NH$_3^-$, or of the formula $(R)_3$—P or $(R)_3$—P=O, wherein R each independently is selected from the group consisting of $(C_2$-$C_{19})$alkyl, $(C_2$-$C_{19})$alkenyl, $(C_2$-$C_{19})$alkynyl, and $(C_6$-$C_{14})$aryl.

24. The double perovskite building block of claim 23, wherein (i) A is Ag(I); B is In(III); and X is Cl; or (ii) A is Ag(I); B is Bi(III); and X is Br.

25. A process for the preparation of a double perovskite nanomaterial represented by the formula $Cs_2ABX_6$ or $L_4[Cs_2ABX_6]_{n-1}ABX_8$, wherein:
- A is a metal ion selected from the group consisting of Ag(I), Au(I), and Cu(I);
- B is a metal ion selected from the group consisting of In(III), Bi(III), Sb(III), Fe(III), and Tl(III);
- X is a halogen;
- L each independently is a ligand of the formula R—COO⁻ or R—CH$_2$NH$_3^+$, or of the formula $(R)_3$—P or $(R)_3$—P=O, wherein R each independently is selected from the group consisting of $(C_2$-$C_{19})$alkyl, $(C_2$-$C_{19})$alkenyl, $(C_2$-$C_{19})$alkynyl, and $(C_6$-$C_{14})$aryl; and
- n is an integer of 2 to 20, representing the number of metal-halide octahedral layers present in the nanomaterial, wherein said nanomaterial is a two-dimensional (2D) material having a shape of a nanoplate having a diameter or lateral dimensions of about 10-50 nm, and a thickness of about 1-10 nm; or a nanosheet having a diameter or lateral dimensions of about 50-1500 nm, and a thickness of about 1-20 nm, said process comprising:
(i) mixing a double perovskite building block according to claim 23 and a cesium salt in a solvent;
(ii) heating the mixture obtained in (i) to a temperature of from about 80° C. to about 120° C.; and
(iii) introducing a cesium salt into said solvent to thereby initiate assembly of said 2D double perovskite nanomaterial.

26. The process of claim 1, wherein said nucleation initiator is introduced into said reaction mixture by rapid injection.

27. The process of claim 3, wherein said non-coordinating solvent is selected from the group consisting of o-xylene, m-xylene, p-xylene, toluene, hexane, heptane, ethylbenzene, benzene, octadecene, and a combination thereof.

28. The process of claim 17, wherein said non-coordinating solvent is selected from the group consisting of o-xylene, m-xylene, p-xylene, toluene, hexane, heptane, ethylbenzene, benzene, octadecene, and a combination thereof.

* * * * *